(12) United States Patent
Nakazawa et al.

(10) Patent No.: US 8,999,768 B2
(45) Date of Patent: Apr. 7, 2015

(54) SEMICONDUCTOR DEVICE MANUFACTURING METHOD

(75) Inventors: Haruo Nakazawa, Matsumoto (JP); Masaaki Ogino, Matsumoto (JP); Tsunehiro Nakajima, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 14/005,256

(22) PCT Filed: Sep. 13, 2011

(86) PCT No.: PCT/JP2011/070908
§ 371 (c)(1),
(2), (4) Date: Sep. 13, 2013

(87) PCT Pub. No.: WO2012/124190
PCT Pub. Date: Sep. 20, 2012

(65) Prior Publication Data
US 2014/0001487 A1   Jan. 2, 2014

(30) Foreign Application Priority Data

Mar. 14, 2011   (JP) .................................. 2011-055945

(51) Int. Cl.
| H01L 21/332 | (2006.01) |
| H01L 29/739 | (2006.01) |
| H01L 21/683 | (2006.01) |
| H01L 29/66  | (2006.01) |

(Continued)

(52) U.S. Cl.
CPC ........ *H01L 29/7396* (2013.01); *H01L 21/6835* (2013.01); *H01L 29/1608* (2013.01); *H01L 29/66068* (2013.01); *H01L 29/7395* (2013.01); *H01L 2221/68327* (2013.01); *H01L 2221/6834* (2013.01); *H01L 2221/6835* (2013.01); *H01L 2221/68381* (2013.01); *H01L 29/66348* (2013.01); *H01L 29/47* (2013.01); *H01L 29/475* (2013.01); *H01L 29/66333* (2013.01); *H01L 29/0661* (2013.01); *H01L 29/0834* (2013.01); *H01L 29/2003* (2013.01)

(58) Field of Classification Search
None
See application file for complete search history.

(56) References Cited

U.S. PATENT DOCUMENTS

| 4,904,609 A     | 2/1990 | Temple                  |
| 7,535,056 B2 *  | 5/2009 | Komachi ......... 257/331 |

(Continued)

FOREIGN PATENT DOCUMENTS

| JP | H02-22869 A   | 1/1990 |
| JP | 2001-185727 A | 7/2001 |

(Continued)

*Primary Examiner* — Benjamin Sandvik
(74) *Attorney, Agent, or Firm* — Rabin & Berdo, P.C.

(57) ABSTRACT

A semiconductor device and its method of manufacture. In the method, a front surface element structure is formed on a front surface of a semiconductor wafer, for example an SiC wafer. Then, a supporting substrate is bonded to wafer's front surface through an adhesive. The wafer's rear surface is ground and polished to thin it, with the supporting substrate bonded to the wafer. Next a V groove passing through the SiC wafer and reaching the adhesive is formed in the wafer's rear surface, and the wafer is cut into individual chips. An electrode film is formed on the groove's side wall and the chip's rear surface and a Schottky junction is formed between a drift layer, which is the chip, and the film. Then, the film is annealed. A tape is attached to the wafer's rear surface which has been cut into the chips. Then, the supporting substrate peels off from the wafer.

9 Claims, 42 Drawing Sheets

(51) Int. Cl.
*H01L 29/06* (2006.01)
*H01L 29/16* (2006.01)
*H01L 29/47* (2006.01)
*H01L 29/08* (2006.01)
*H01L 29/20* (2006.01)

(56) References Cited

U.S. PATENT DOCUMENTS

| | | | |
|---|---|---|---|
| 2001/0009287 A1* | 7/2001 | Fujihira et al. | 257/328 |
| 2006/0038206 A1 | 2/2006 | Shimoyama et al. | |
| 2006/0249797 A1 | 11/2006 | Nakazawa et al. | |
| 2010/0093164 A1* | 4/2010 | Nakazawa et al. | 438/535 |
| 2011/0108883 A1 | 5/2011 | Tsukamoto et al. | |

FOREIGN PATENT DOCUMENTS

| | | | |
|---|---|---|---|
| JP | 2002-076017 A | | 3/2002 |
| JP | 2002-299624 A | | 10/2002 |
| JP | 2003-218354 A | | 7/2003 |
| JP | 2003218354 A | * | 7/2003 |
| JP | 2004-327708 A | | 11/2004 |
| JP | 2004-336008 A | | 11/2004 |
| JP | 3760688 B2 | | 3/2006 |
| JP | 2006-156926 A | | 6/2006 |
| JP | 2006-303410 A | | 11/2006 |
| JP | 2006303410 A | * | 11/2006 |
| JP | 2009-123914 A | | 6/2009 |
| JP | 2009123914 A | * | 6/2009 |
| WO | WO-2009/139417 A1 | | 11/2009 |

* cited by examiner

SEMICONDUCTOR DEVICE MANUFACTURING METHOD

FIELD

The present invention relates to a semiconductor device manufacturing method and a semiconductor device.

BACKGROUND

In recent years, attention has been paid to the application of a bidirectional switching element to a direct link conversion circuit, such as a matrix converter which performs, for example, AC (alternating current)/AC conversion, AC/DC (direct current) conversion, and DC/AC conversion in a semiconductor power conversion device, in terms of a reduction in the size and weight of a circuit, an increase in the efficiency of the circuit, a high speed response, and low costs.

The matrix converter has a higher power conversion efficiency than an inverter/converter. In general, the inverter/converter generates a DC intermediate voltage from an AC power supply and converts the intermediate voltage into an AC voltage. However, the matrix converter directly generates the AC voltage from the AC power supply, without generating the intermediate voltage.

In addition, since an electrolytic capacitor is used as a capacitor for generating the intermediate voltage in the inverter/converter, there is a problem that the life span of the device is determined by the life span of the electrolytic capacitor. In contrast, in the matrix converter, it is not necessary to provide the capacitor for generating the intermediate voltage between the AC power supply and an AC voltage output unit. Therefore, it is possible to avoid the problem of the inverter/converter.

FIGS. 29 and 30 are equivalent circuit diagrams illustrating a matrix converter according to the related art. As described above, a bidirectional switching element in which a current can flow bi-directionally is used as a power device which is used in the matrix converter. The bidirectional switching element is not formed by a single element, but includes, for example, two diodes 101 and two transistors 102, as illustrated in FIG. 29.

In the bidirectional switching element illustrated in FIG. 29, the diode 101 is provided in order to maintain the breakdown voltage of the power device when a reverse voltage is applied to the transistor 102. This is because a general IGBT (Insulated Gate Bipolar Transistor) or MOSFET (Metal Oxide Semiconductor Field Effect Transistor) which is used as the transistor 102 cannot ensure the reverse breakdown voltage.

In recent years, a reverse blocking IGBT (RB-IGBT: Reverse Blocking IGBT) has been developed which ensures the breakdown voltage even when the reverse voltage is applied. The bidirectional switching element includes, for example, two reverse blocking IGBTs 103 as illustrated in FIG. 30. The bidirectional switching element illustrated in FIG. 30 has a smaller number of elements than the bidirectional switching element illustrated in FIG. 29. Therefore, the bidirectional switching element has low power loss and the total size of the elements is small. Therefore, when the bidirectional switching element illustrated in FIG. 30 is applied to the matrix converter, it is possible to provide a matrix converter with a small size and low costs.

As the bidirectional switching element using the reverse blocking IGBT, an element with a reverse breakdown voltage has been proposed in which a MOS gate structure including a gate electrode and an emitter electrode is provided on one surface of an n⁻ drift layer, which is a semiconductor substrate having a GaN (gallium nitride) semiconductor or an SiC (silicon carbide) semiconductor as a main semiconductor crystal, a cutting plane used to cut the semiconductor substrate into chips includes a p-type protective region which connects the front and rear surfaces of the n⁻ drift layer, and a collector electrode which comes into contact with the rear surface of the n⁻ drift layer includes a Schottky metal film (for example, see the following Patent Literature 1).

The reverse blocking IGBT includes reverse blocking capability which is substantially the same as forward blocking capability. In the reverse blocking IGBT, in order to ensure the reverse blocking capability, a pn junction is formed by a diffusion layer (hereinafter, referred to as a separation layer) which extends from the rear surface to the front surface of the semiconductor chip through the drift layer and separates the side surface of the semiconductor chip and the drift layer. The pn junction maintains the reverse breakdown voltage of the reverse blocking IGBT.

Next, a method of forming the separation layer will be described. FIGS. 31 to 35 are cross-sectional views illustrating a method of manufacturing a reverse blocking IGBT with silicon according to the related art. Here, a method will be described which diffuses a dopant from an impurity source (liquid diffusion source) coated on a semiconductor wafer (coating diffusion method) to form a diffusion layer which will be a separation layer. First, for example, an oxide film 112 is formed on the front surface of an n-type semiconductor wafer 111 by thermal oxidation (FIG. 31).

The thickness of the oxide film 112 is, for example, about 2.5 μm. Then, an opening portion 113 for forming the separation layer is formed in the oxide film 112 by photolithography to form a mask oxide film 114 for a dopant mask (FIG. 32). Then, a boron (B) source 115 is coated on the mask oxide film 114 so as to fill the opening portion 113.

Then, the semiconductor wafer 111 is put into a diffusion furnace and a heat treatment is performed for the semiconductor wafer 111 at a high temperature for a long time to form a p-type diffusion layer 116 in a surface layer of the front surface of the semiconductor wafer 111 (FIG. 33). The thickness of the diffusion layer 116 is, for example, about several hundreds of micrometers. In the subsequent process, the diffusion layer 116 becomes the separation layer.

Then, a front surface element structure 117 (see FIG. 35) of the reverse blocking IGBT is formed on the front surface of the semiconductor wafer 111. Then, the rear surface of the semiconductor wafer 111 is ground until the diffusion layer 116 is exposed and the semiconductor wafer 111 is thinned (FIG. 34). Then, a rear surface element structure including a p collector region 118 and a collector electrode 119 is formed on the ground rear surface of the semiconductor wafer 111 (FIG. 35).

Then, the semiconductor wafer 111 is diced into chips along scribe lines (not illustrated) which are formed at the center of the diffusion layer 116. In this way, as illustrated in FIG. 35, a reverse blocking IGBT in which the separation layer, which is the diffusion layer 116, is formed on a cut plane 120 of the chip is completed.

FIGS. 36 to 39 are cross-sectional views illustrating another example of the method of manufacturing the reverse blocking IGBT with silicon according to the related art. Here, a method will be described in which a trench (groove) is formed in a semiconductor wafer and a diffusion layer which will be a separation layer is formed on the side surface of the trench. First, for example, an oxide film 122 with a thickness of about several micrometers is formed on the front surface of an n-type semiconductor wafer 121 by, for example, thermal oxidation (FIG. 36).

Then, a trench 123 is formed in the front surface of the semiconductor wafer 121 by dry etching (FIG. 37). The trench 123 has a depth of, for example, about several hundreds of micrometers. In this case, an opening portion 124 with the same with as the trench 123 is formed in the oxide film 122 to form a mask oxide film 125 for a dopant mask.

Then, impurities 126 are implanted into the bottom and side wall of the trench 123 by a vapor-phase diffusion method to form an impurity layer 127 on the bottom and side wall of the trench 123 (FIG. 38). In the subsequent process, the impurity layer 127 becomes the separation layer. Then, a front surface element structure is formed on the front surface of the semiconductor wafer 121, the rear surface of the semiconductor wafer 121 is ground until the impurity layer 127 is exposed, and a rear surface element structure is formed on the ground surface (FIG. 39).

Then, the trench 123 is filled with a reinforcing material 128 and the semiconductor wafer 121 is diced into chips along scribe lines. The scribe lines are formed at positions where the semiconductor wafer 121 can be diced along the center of the trench 123. In this way, as illustrated in FIG. 39, a reverse blocking IGBT is completed in which the separation layer, which is the impurity layer 127, is formed on a cut plane 129 of the chip.

The following method using silicon has been proposed as a method of forming the separation layer on the side wall of the trench. A substrate which is made of a first-conduction-type semiconductor material and has a second-conduction-type epitaxial layer formed thereon is prepared. Then, a first-conduction-type second region is formed in the upper surface of the epitaxial layer and a trench which passes through the epitaxial layer from the upper surface of the second region, reaches the substrate, and surrounds an active layer is formed. Then, first-conduction-type impurities are implanted into the side wall of the trench and an annealing process is performed to form a low-resistance path which electrically connects the second region and the substrate (for example, see the following Patent Literature 2).

As another method using silicon, the following method has been proposed. A groove which reaches the pn junction between an n base region and a p collector region is formed outside a portion which will be a guard ring structure. Then, a surface layer of the groove is removed (etched) by a chemical process. In this case, the bottom of the groove after etching is so deep as to traverse the pn junction. A p region which comes into contact with a p collector region in the rear surface of the substrate and a p region in the front surface of the substrate is formed from the surface of the groove (for example, see the following Patent Literature 3).

As another method using silicon, a method has been proposed in which a P layer is formed on the side wall of an N base layer so as to come into contact with a P collector layer and an outer circumferential portion of a breakdown voltage structure (for example, see the following Patent Literature 4).

In the method of manufacturing the reverse blocking IGBT illustrated in FIGS. 31 to 34, when the separation layer (diffusion layer 116) with a diffusion depth of about several hundreds of micrometers is formed, a diffusion process needs to be performed at a high temperature for a long time. Therefore, a quartz jig, such as a quartz board, a quartz pipe (quartz tube), or a quartz nozzle forming a diffusion furnace, deteriorates, contaminants are received from a heater, or the strength of the quartz jig is reduced by devitrification.

In addition, it is necessary to form a high-quality and thick mask oxide film 114 with resistance to the diffusion process which is performed at a high temperature for a long time (for example, 1300° C. and 200 hours). For example, the thickness of the mask oxide film 114 needs to be about 2.5 µm such that boron does not penetrate the mask oxide film 114 in the diffusion process. In order to form a thermally-oxidized film with a thickness of about 2.5 µm, it is necessary to perform thermal oxidation, for example, at a temperature of 1150° C. for 200 hours using a dry (dry oxygen atmosphere) oxidation method.

A wet oxidation method or a pyrogenic oxidation which has film quality slightly lower than the dry oxidation method, but has a processing time shorter than that the dry oxidation method requires a processing time of about 15 hours. In addition, since a large amount of oxygen is introduced into the semiconductor wafer during the oxidation process, an oxygen precipitate is generated, a crystal defect, such as an oxidation induced stacking fault (OSF), is introduced, or an oxygen donor is generated. As a result, the characteristics of the device deteriorate or the reliability of the device is reduced.

In the dry oxidation method, since the diffusion process is generally performed in an oxidation atmosphere at a high temperature for a long time as described above, oxygen is introduced between the grids in the semiconductor wafer and an oxygen precipitate is generated, an oxygen donor is generated, or a crystal defect, such as an oxidation induced stacking fault or slip dislocation, is introduced. As a result, a leakage current in the pn junction increases, the breakdown voltage or reliability of the insulating film formed on the semiconductor wafer is significantly reduced. In addition, oxygen introduced into the semiconductor wafer changes to a donor during the diffusion process and the breakdown voltage is reduced.

In the method of manufacturing the reverse blocking IGBT illustrated in FIGS. 31 to 34, boron is substantially isotropically diffused from the opening portion 113 of the mask oxide film 114. Therefore, when boron is diffused about 200 µm in the depth direction, it is also diffused about 180 µm in the lateral direction, which prevents a reduction in a device pitch or a chip size.

In the method of manufacturing the reverse blocking IGBT illustrated in FIGS. 36 to 39, the trench with a high aspect ratio is formed and the separation layer is formed on the side wall of the trench. Therefore, it is possible to reduce the device pitch, as compared to the method of manufacturing the reverse blocking IGBT illustrated in FIGS. 31 to 34. However, the time required to form a trench with a depth of about 200 µm in the semiconductor wafer using the typical dry etching device is about 100 minutes per wafer. Therefore, the lead time increases or the number of maintenance operations for the dry etching device increases.

When a deep trench is formed by the dry etching process using a silicon oxide film ($SiO_2$) mask, a silicon oxide film with a thickness of about several micrometers is needed since the selectivity of the mask is equal to or less than about 50. As a result, manufacturing costs increase, a process-induced crystal defect, such as an oxidation induced stacking fault or an oxygen precipitate, is introduced, or the yield rate is reduced.

When the trench with a high aspect ratio is formed by dry etching, the following problems arise. FIG. 40 is a cross-sectional view illustrating a main portion of the reverse blocking IGBT according to the related art during a manufacturing process. As illustrated in FIG. 40, for example, a resist residue 131 or a chemical residue 132 is likely to be generated in the trench 123. As a result, yield or reliability is reduced.

In general, in the introduction of a dopant, such as phosphorus (P) or boron, into the side wall of the trench, since the side wall of the trench is vertical, the semiconductor wafer is inclined and ions are implanted into the inclined semiconductor wafer to introduce the dopant into the side wall of the trench. However, when impurities are introduced into the trench with a high aspect ratio, the ion implantation method is not appropriate, for example, since the effective dose is reduced, the implantation time increases due to the reduction in the effective dose, the effective projection range is narrowed, the dose is reduced due to a screen oxide film, or implantation uniformity is reduced.

Therefore, instead of the ion implantation method, a vapor-phase diffusion method is used in which a semiconductor wafer is exposed to a gaseous impurity atmosphere, such as phosphine ($PH_3$) or diborane ($B_2H_6$). However, the vapor-phase diffusion method is worse than the ion implantation method in terms of accurately controlling the dopant dose. In the vapor-phase diffusion method, in many cases, the dose of the dopant to be introduced is restricted by a solubility limit and the performance of accurately controlling the dopant dose is lower than that in the ion implantation method.

When the aspect ratio of the trench is high and the trench is filled with the insulating film, an empty space which is called a void, is likely to be generated in the trench and reliability is reduced. In addition, in the manufacturing methods disclosed in Patent Literature 2 to Patent Literature 4, when the semiconductor wafer is diced into the individual chips, it is considered that a process of filling the trench with, for example, a reinforcing material, is needed, which results in an increase in manufacturing costs.

As a method for solving the above-mentioned problems, the following method using silicon has been proposed. FIGS. 41 and 42 are cross-sectional views illustrating the reverse blocking IGBT according to the related art. In a semiconductor chip 140 including a side surface 141 which is tapered such that the width thereof increases from the emitter to the collector as illustrated in FIG. 41 or a semiconductor chip 150 including a side surface 151 which is tapered such that the width thereof increases from the collector to the emitter as illustrated in FIG. 42, impurity ions are implanted into the tapered side surface 141 or 151 and annealing is performed to form a separation layer 142 or 152 (for example, see Patent Literature 5).

As a method of processing the side surface of the semiconductor chip in a tapered shape, a method using silicon has been proposed which selectively removes a portion of a semiconductor wafer using anisotropic etching (for example, see the following Patent Literature 6 and the following Patent Literature 7).

In the reverse blocking IGBT with the tapered side surface 151 whose width increases from the collector to the emitter as illustrated in FIG. 42, it is possible to widely use the emitter-side main surface, as compared to the reverse blocking IGBT including the tapered side surface 141 illustrated in FIG. 41. Therefore, it is possible to increase the width of an emitter region or a channel region which is formed in a surface layer of the emitter-side main surface and thus manufacture a reverse blocking IGBT with high current density. In addition, it is possible to manufacture a reverse blocking IGBT which has the same current rating as that according to the related art and a smaller chip area than that according to the related art.

In the reverse blocking IGBTs illustrated in FIGS. 41 and 42, impurity ions are implanted into the tapered side surfaces 141 and 151 and annealing is performed to form the separation layers 142 and 152. Therefore, the diffusion process illustrated in FIGS. 31 to 34 which is performed at a high temperature for a long time is not needed. As a result, a crystal defect or a defect caused by oxygen does not occur in the semiconductor wafer or the diffusion furnace does not deteriorate.

In addition the aspect ratio of the groove formed by the tapered side surface 141 or 151 is lower than that of the trench (see FIGS. 36 to 39). Therefore, it is possible to simply introduce a dopant using ion implantation, without generating a void or a residue (see FIG. 40) in the tapered side surface 141 or 151.

CITATION LIST

Patent Literature

Patent Literature 1: JP 2009-123914 A
Patent Literature 2: JP 2-22869 A
Patent Literature 3: JP 2001-185727 A
Patent Literature 4: JP 2002-76017 A
Patent Literature 5: JP 2006-303410 A
Patent Literature 6: JP 2004-336008 A
Patent Literature 7: JP 2006-156926 A

SUMMARY

Technical Problem

SiC or GaN have good characteristics that the band gap thereof is about three times more than that of silicon (Si) and the breakdown field strength thereof is about ten times more than that of silicon. Therefore, a power device which can perform high-speed switching at a low on-voltage has been researched and developed. However, the inventors studied the semiconductor material and found the following new problems.

For example, in a power device using a substrate (hereinafter, simply referred to as an SiC substrate) having SiC or GaN as a semiconductor material, the thickness of a drift region can be about one tenth of that in a power device using silicon as a semiconductor material. Specifically, in a vertical power device using an SiC substrate, the thickness of the drift layer can be about 15 μm at a breakdown voltage of 1200 V class and can be equal to or less than 10 μm at a breakdown voltage of 600 V.

In addition, SiC or GaN has a wider band gap than silicon and has a high built-in potential, for example, when it is used to form an IGBT. When a device with a breakdown voltage of 600 V or 1200 V is manufactured, SiC or GaN is used as a semiconductor material. In addition, SiC or GaN starts to be used as a semiconductor material when a MOSFET or J-FET (Junction-Field Effect Transistor) is manufactured.

However, since the MOSFET or J-FET is not provided with the pn junction which maintains the voltage when the reverse voltage is applied, it is difficult to obtain a reverse breakdown voltage. Therefore, in order to use the MOSFET or the J-FET as a reverse blocking device, it is necessary to form the Schottky junction between the drain electrode and the drift layer. In this case, since the overall thickness of the device is substantially equal to the thickness of the drift layer, it is very difficult to manufacture the device.

That is, it is preferable that the thickness of the SiC substrate be about 10 μm in order to manufacture a reverse blocking MOSFET or a reverse blocking IGBT with low loss using the SiC substrate. In this case, a wafer made of SiC is thinned and each manufacturing process is sequentially performed for the thinned wafer. Therefore, the wafer is likely to be broken or cracked. As a result, the yield rate of the reverse blocking device is likely to be reduced.

The invention has been made in view of the above-mentioned problems and an object of the invention is to provide a method of manufacturing a semiconductor device with low loss and a semiconductor device. In addition, an object of the invention is to provide a method of manufacturing a semiconductor device with high yield and a semiconductor device.

Solution to Problem

In order to solve the above-mentioned problems and achieve the objects of the invention, according to an aspect of the invention, there is provided a semiconductor device manufacturing method including forming a front surface element structure on a front surface of a semiconductor wafer, bonding a supporting substrate to the front surface of the semiconductor wafer on which the front surface element structure is formed, forming a groove in a rear surface of the semiconductor wafer, providing an electrode film on a side wall of the groove and the rear surface of the semiconductor wafer to form a Schottky junction between the semiconductor wafer and the electrode film, and peeling the supporting substrate from the semiconductor wafer.

According to the above-mentioned structure it is possible to form the Schottky junction between the side wall of the groove and the rear surface of the semiconductor wafer, without breaking or cracking the semiconductor wafer. In addition, it is possible to form the Schottky junction on the side surface and the rear surface of a semiconductor chip, with the thinned semiconductor wafer cut into the chip.

In order to solve the above-mentioned problems and achieve the objects of the invention, according to another aspect of the invention, there is provided a semiconductor device manufacturing method including forming a front surface element structure on a front surface of a semiconductor wafer of a first conduction type, bonding a supporting substrate to the front surface of the semiconductor wafer on which the front surface element structure is formed, forming a groove in a rear surface of the semiconductor wafer, implanting a second-conduction-type impurity into a side wall of the groove, activating the second-conduction-type impurity implanted into the side wall of the groove to form a first semiconductor region of a second conduction type in a surface layer of the side wall of the groove, providing an electrode film on the rear surface of the semiconductor wafer to form a Schottky junction between the semiconductor wafer and the electrode film, and peeling the supporting substrate from the semiconductor wafer.

According to the above-mentioned structure, it is possible to form the Schottky junction on the side wall of the groove and the rear surface of the semiconductor wafer, without breaking or cracking the semiconductor wafer. In addition, it is possible to form the Schottky junction between the side surface and the rear surface of a semiconductor chip, with the thinned semiconductor wafer cut into the chip.

The semiconductor device manufacturing method according to the above-mentioned aspect of the invention may further include selectively implanting the second-conduction-type impurity into the rear surface of the semiconductor wafer after the groove is formed in the semiconductor wafer and activating the second-conduction-type impurity implanted into the rear surface of the semiconductor wafer to selectively form a second semiconductor region of the second conduction type in a surface layer of the rear surface of the semiconductor wafer.

According to the above-mentioned structure, the leakage current can be reduced by the second-conduction-type semiconductor region which is selectively formed in the rear surface of the semiconductor wafer.

In the semiconductor device manufacturing method according to the above-mentioned aspect of the invention, the front surface element structure may be a front surface element structure of a field effect transistor, and the electrode film may be a drain electrode.

According to the above-mentioned structure, it is possible to form a reverse blocking MOSFET.

In order to solve the above-mentioned problems and achieve the objects of the invention, according to another aspect of the invention, there is provided a semiconductor device manufacturing method including forming a front surface element structure on a front surface of a semiconductor wafer of a first conduction type, bonding a supporting substrate to the front surface of the semiconductor wafer on which the front surface element structure is formed, forming a groove in a rear surface of the semiconductor wafer, implanting a second-conduction-type impurity into the rear surface of the semiconductor wafer, activating the second-conduction-type impurity implanted into the rear surface of the semiconductor wafer to form a third semiconductor region of a second conduction type in a surface layer of the rear surface of the semiconductor wafer, implanting the second-conduction-type impurity into a side wall of the groove, activating the second-conduction-type impurity implanted into the side wall of the groove to form a first semiconductor region of the second conduction type in a surface layer of the side wall of the groove, providing an electrode film on the side wall of the groove and the rear surface of the semiconductor wafer to form a Schottky junction between the first and third semiconductor regions and the electrode film, and peeling the supporting substrate from the semiconductor wafer.

According to the above-mentioned structure, it is possible to form the electrode film on the side wall of the groove and the rear surface of the semiconductor wafer, without breaking or cracking the semiconductor wafer. In addition, it is possible to form the electrode film on the side surface and the rear surface of a semiconductor chip, with the thinned semiconductor wafer cut into the chip.

In the semiconductor device manufacturing method according to the above-mentioned aspect of the invention, after the second-conduction-type impurity is implanted into the rear surface of the semiconductor wafer and is implanted into the side wall of the groove, the second-conduction-type impurity implanted into the rear surface of the semiconductor wafer and the side wall of the groove may be activated.

In the semiconductor device manufacturing method according to the above-mentioned aspect of the invention, the front surface element structure may be a front surface element structure of an insulated gate bipolar transistor and the electrode film may be a collector electrode.

According to the above-mentioned structure, it is possible to form a reverse blocking IGBT.

In the semiconductor device manufacturing method according to the above-mentioned aspect of the invention, the groove may pass through the semiconductor wafer and reach the supporting substrate.

According to the above-mentioned structure, it is possible to cut the semiconductor wafer into chips during a process of forming the reverse blocking MOSFET or the reverse blocking IGBT.

In the semiconductor device manufacturing method according to the above-mentioned aspect of the invention, the width of the groove may be gradually reduced from the rear surface of the semiconductor wafer in a depth direction of the semiconductor wafer.

According to the above-mentioned structure, it is possible to easily form the electrode film on the side surface of the chip.

In the semiconductor device manufacturing method according to the above-mentioned aspect of the invention, the semiconductor wafer may be made of a semiconductor material with a wider band gap than silicon.

According to the above-mentioned structure, it is possible to form a reverse blocking MOSFET and a reverse blocking IGBT with a low on-voltage. It is possible to form a reverse blocking MOSFET and a reverse blocking IGBT which can perform high-speed switching.

In the semiconductor device manufacturing method according to the above-mentioned aspect of the invention, the semiconductor wafer may be made of silicon carbide.

According to the above-mentioned structure, it is possible to form a reverse blocking MOSFET and a reverse blocking IGBT with a low on-voltage. It is possible to form a reverse blocking MOSFET and a reverse blocking IGBT which can perform high-speed switching.

In order to solve the above-mentioned problems and achieve the objects of the invention, according to another aspect of the invention, there is provided a semiconductor device including a semiconductor substrate that is made of a semiconductor material with a wider band gap than silicon, a front surface element structure of a field effect transistor that is provided on a front surface of the semiconductor substrate, and a drain electrode that comes into contact with a side surface and a rear surface of the semiconductor substrate. A Schottky junction is formed between the semiconductor substrate and the drain electrode.

According to the above-mentioned structure, it is possible to provide a reverse blocking MOSFET with a low built-in voltage. In addition, it is possible to provide a reverse blocking MOSFET with a low on-voltage. It is possible to provide a reverse blocking MOSFET which can perform high-speed switching.

In order to solve the above-mentioned problems and achieve the objects of the invention, according to another aspect of the invention, a semiconductor device including a semiconductor substrate of a first conduction type that is made of a semiconductor material with a wider band gap than silicon, a front surface element structure of a field effect transistor that is provided on a front surface of the semiconductor substrate, a semiconductor region of a second conduction type that is provided in a surface layer of a side surface of the semiconductor substrate, and a drain electrode that comes into contact with a rear surface of the semiconductor substrate. A Schottky junction is formed between the semiconductor substrate and the drain electrode.

According to the above-mentioned structure, it is possible to provide a reverse blocking MOSFET with a low built-in voltage. In addition, it is possible to provide a reverse blocking MOSFET with a low on-voltage. It is possible to provide a reverse blocking MOSFET which can perform high-speed switching.

The semiconductor device according to the above-mentioned aspect of the invention may further include a semiconductor region of the second conduction type that is selectively provided in a surface layer of the rear surface of the semiconductor substrate and comes into contact with the drain electrode.

According to the above-mentioned structure, it is possible to form a reverse blocking MOSFET with a small amount of leakage current.

In the semiconductor device according to the above-mentioned aspect of the invention, the semiconductor substrate may have a tapered side surface.

According to the above-mentioned structure, it is possible to form a reverse blocking MOSFET with a stable and high yield rate.

According to the above-mentioned aspects of the invention, it is possible to form a reverse blocking MOSFET and a reverse blocking IGBT with low loss and a stable and high yield rate on a thin SiC wafer. In addition, since the supporting substrate is used, it is possible to ground and polish the SiC wafer to reduce the thickness of the SiC wafer after the front surface element structure is formed on the front surface of the SiC wafer, without breaking or cracking the SiC wafer.

Advantageous Effects of Invention

According to the semiconductor device manufacturing method and the semiconductor device of the invention, it is possible to provide a semiconductor device with low loss. In addition, it is possible to improve yield.

DESCRIPTION OF EMBODIMENTS

Figure 1:
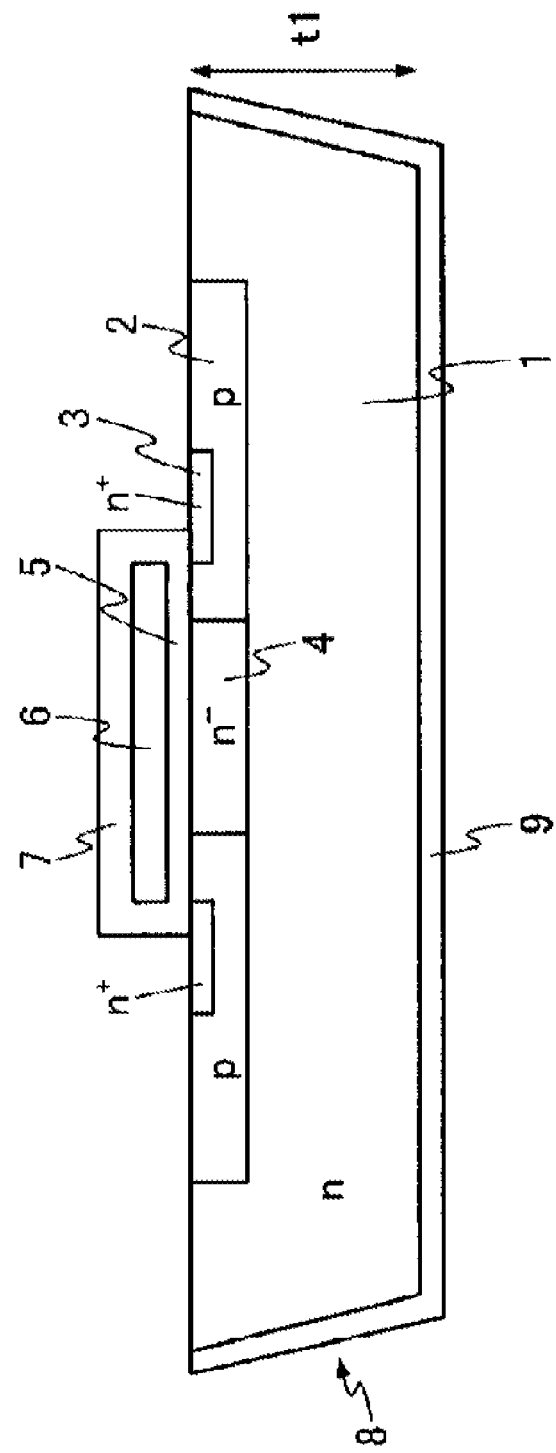
FIG. 1 is a cross-sectional view illustrating a semiconductor device according to Embodiment 1.

Hereinafter, semiconductor device manufacturing methods and semiconductor devices according to the exemplary embodiments of the invention will be described in detail with reference to the accompanying drawings. In the specification and the accompanying drawings, in the layers or regions having "n" or "p" appended thereto, an electron or a hole means a major carrier. In addition, symbols "+" and "−" added to n or p mean that impurity concentration is higher or lower than that of the layer or the region without the symbols. In the description of the following embodiments and the accompanying drawings, the same components are denoted by the same reference numerals and the description thereof will not be repeated.

(Embodiment 1)

FIG. 1 is a cross-sectional view illustrating a semiconductor device according to Embodiment 1. The semiconductor device illustrated in FIG. 1 is a reverse blocking MOSFET. In the reverse blocking MOSFET illustrated in FIG. 1, a MOS gate structure including a p base region 2, an n$^+$ source region 3, an n$^-$ contact region 4, a gate insulating film 5, a gate electrode 6, and an interlayer insulating film 7 is formed on the front surface of an n-type substrate 1 which will be a drift layer.

The n-type substrate 1 is made of a semiconductor material with a wider band gap than silicon. Examples of the semiconductor material with a wider band gap than silicon include silicon carbide (SiC) and gallium nitride (GaN).

After the reverse blocking MOSFET is completed, the final thickness of the n-type substrate 1, that is, the thickness t1 of the drift layer is preferably about 15 μm when the breakdown voltage is 1200 V. This is because the thickness range makes it possible to improve high-speed switching characteristics. When the breakdown voltage is 600 V, the thickness t1 of the drift layer may be, for example, about 10 μm.

For example, an epitaxial wafer is cut into chips and the chip is the n-type substrate 1. A side surface 8 of the n-type substrate 1 has a tapered shape. Specifically, the side surface 8 of the n-type substrate 1 is inclined such that the width of the n-type substrate 1 gradually increases from the drain side (the rear surface side of the n-type substrate 1) to the source side (the front surface side of the n-type substrate 1).

A drain electrode 9 is provided on the rear surface and the tapered side surface 8 of the n-type substrate 1 so as to come into contact with the entire rear surface and the entire side surface 8 of the n-type substrate 1. On the rear surface and the side surface 8 of the n-type substrate 1, a Schottky junction between the n-type substrate 1 and the drain electrode 9 is formed. Since the Schottky junction between the n-type substrate 1 and the drain electrode 9 is formed, the reverse blocking MOSFET illustrated in FIG. 1 maintains a reverse voltage when the reverse voltage is applied.

Next, a method of manufacturing the reverse blocking MOSFET illustrated in FIG. 1 will be described. FIGS. 2 to 8 are cross-sectional views illustrating the method of manufacturing the semiconductor device according to Embodiment 1. Here, a case in which the reverse blocking MOSFET with a breakdown voltage of 1200 V is manufactured using an SiC wafer 11 will be described. In FIGS. 2 to 8, the SiC wafer 11 is illustrated with the front surface up. However, the direction of the main surface of the SiC wafer 11 is appropriately changed depending on each process (which holds for FIGS. 10 to 12 and FIGS. 16 to 23).

Figure 2:
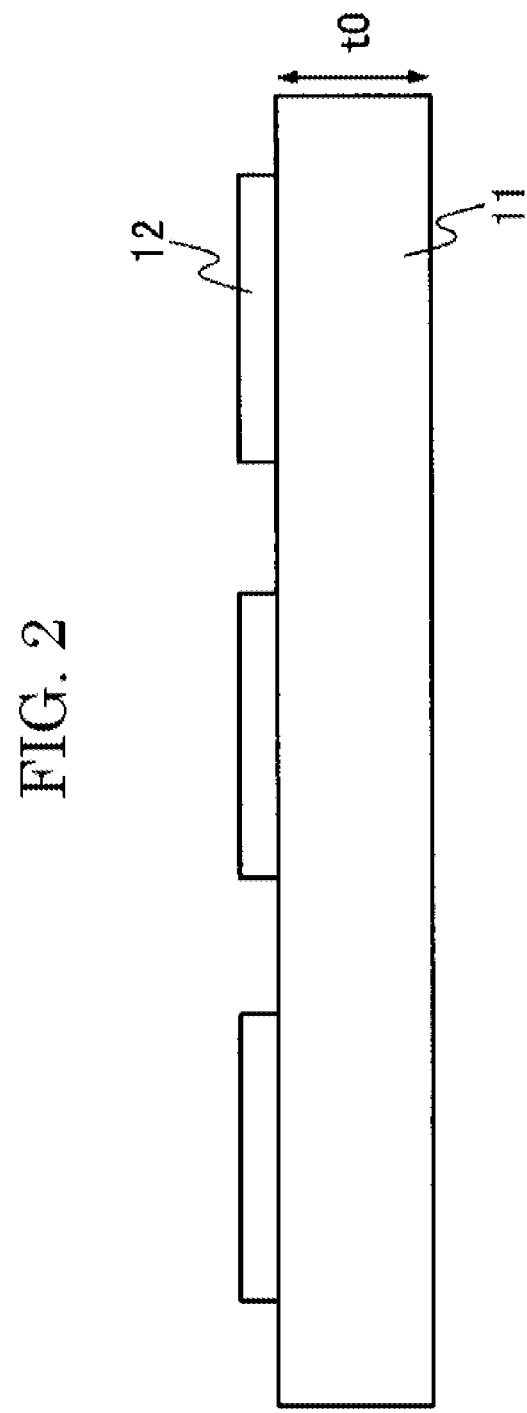
FIG. 2 is a cross-sectional view illustrating a method of manufacturing the semiconductor device according to Embodiment 1.

First, for example, an n-type SiC wafer 11 is prepared. The thickness t0 of the SiC wafer 11 may be, for example, 400 μm. Then, as illustrated in FIG. 2, a MOS gate structure (a front surface element structure: see FIG. 1) 12 of the reverse blocking MOSFET including the p base region 2, the n$^+$ source region 3, and the gate electrode 6 is formed on the front surface of the SiC wafer 11. The MOS gate structure 12 is formed on the front surface of a region which will be a chip. The region which will be a chip on the SiC wafer 11 is provided, for example, in an island shape between the scribe lines which are arranged in a lattice shape.

Figure 3:
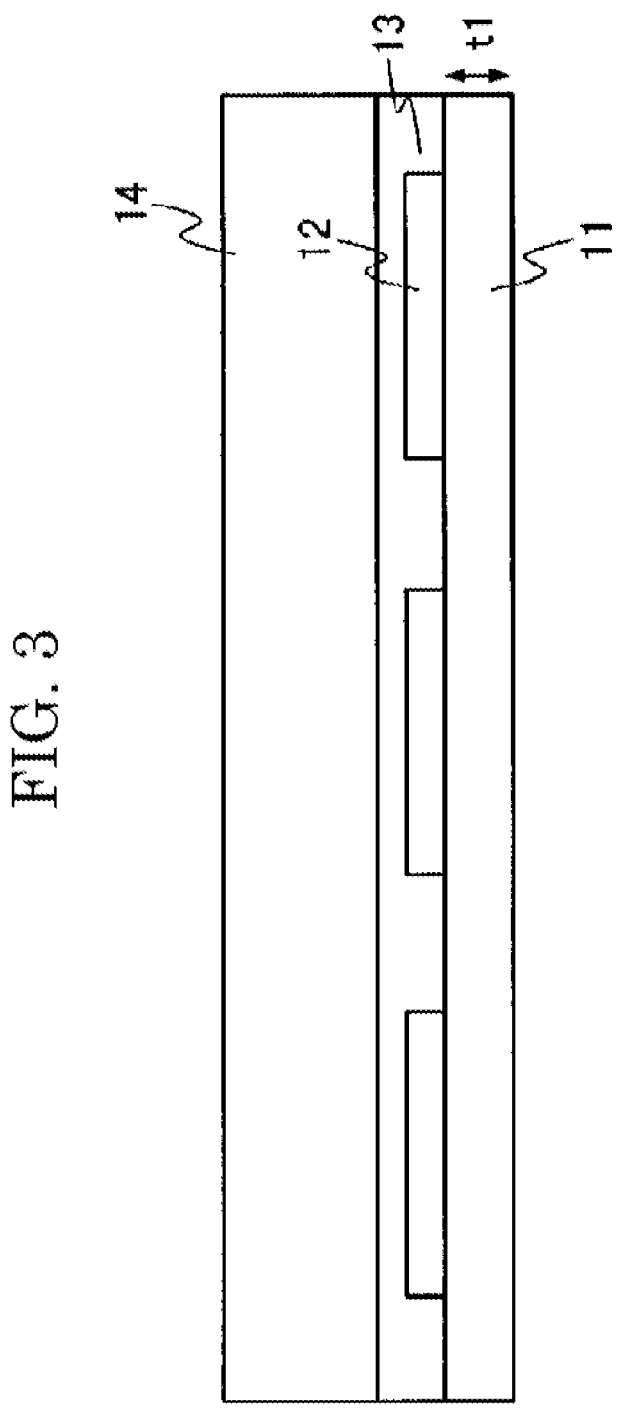
FIG. 3 is a cross-sectional view illustrating the method of manufacturing the semiconductor device according to Embodiment 1.

Then, as illustrated in FIG. 3, a supporting substrate 14 which is made of, for example, glass is bonded to the front surface of the SiC wafer 11 through an adhesive layer 13. Specifically, an adhesive which will be the adhesive layer 13 is coated on the front surface of the SiC wafer 11 by a spin coater. Then, the supporting substrate 14 is placed on the adhesive which will be the adhesive layer 13 and the supporting substrate 14 is bonded to the front surface of the SiC wafer 11 while being pressed in a vacuum atmosphere. In this way, the SiC wafer 11 and the supporting substrate 14 are bonded to each other through the adhesive layer 13.

It is preferable that the adhesive layer 13 and the supporting substrate 14 have heat resistance to an annealing process which will be performed later in order to form a drain electrode 9. Specifically, it is preferable that the adhesive layer 13 and the supporting substrate 14 have resistance to, for example, a temperature of 400° C. The adhesive layer 13 may have a sufficient thickness to cover, for example, the MOS gate structure 12.

It is preferable that the diameter of the supporting substrate 14 be slightly larger than that of the SiC wafer 11. Specifically, it is preferable that the diameter of the supporting substrate 14 be so large that the adhesive which is coated by the spin coater so as to cover the upper end of the SiC wafer 11 can flow. More specifically, for example, when the diameter of the SiC wafer 11 is 150 mm, it is preferable that the diameter of the supporting substrate 14 be about 150.5 mm In this case, it is possible to form the adhesive layer 13 so as to protect the end of the SiC wafer 11.

For example, when wax is coated on the SiC wafer 11 and is heated at a temperature of about 100° C. to bond the supporting substrate 14, the SiC wafer 11 is likely to be bonded to the supporting substrate 14 while being inclined with respect to the supporting substrate 14 (not illustrated). However, when the SiC wafer 11 is bonded to the supporting substrate 14 as described above, the SiC wafer 11 can be bonded to the supporting substrate 14 without being inclined with respect to the supporting substrate 14.

Then, the rear surface (a surface opposite to the surface on which the MOS gate structure 12 is formed) of the SiC wafer 11 to which the supporting substrate 14 has been bonded is ground to a thickness of, for example, 18 μm. Then, the SiC wafer 11 is ground by, for example, about 3 μm (for example, by CMP or polishing) from the rear surface to planarize the rear surface of the SiC wafer 11 and to remove fine grinding traces (stress release). In this way, the final thickness t1 of the SiC wafer 11 is reduced to, for example, about 15 μm.

Figure 4:
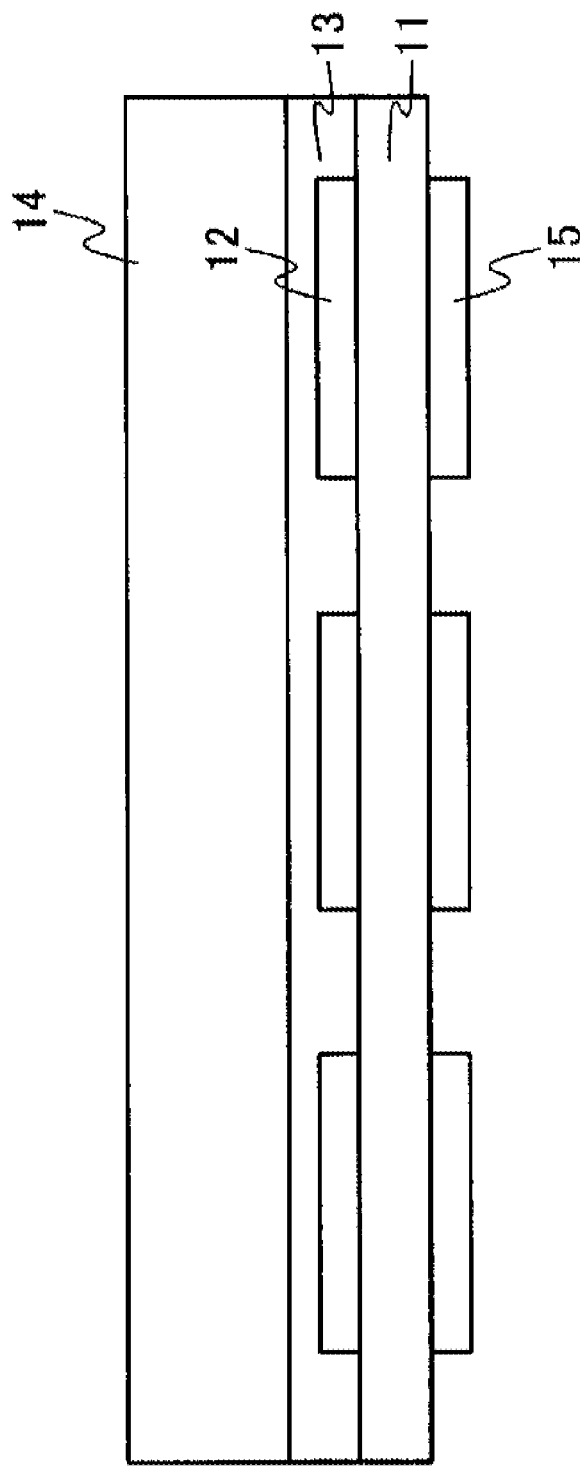
FIG. 4 is a cross-sectional view illustrating the method of manufacturing the semiconductor device according to Embodiment 1.

Then, as illustrated in FIG. 4, a resist mask 15 is formed on the rear surface of the SiC wafer 11 by photolithography. The resist mask 15 is an etching mask used in an etching process for forming the side surface of the chip (the side surface 8 of the n-type substrate 1 illustrated in FIG. 1) cut from the SiC wafer 11 in a tapered shape and a region corresponding to a groove to be formed in the SiC wafer 11 is opened in the resist mask.

Figure 5:
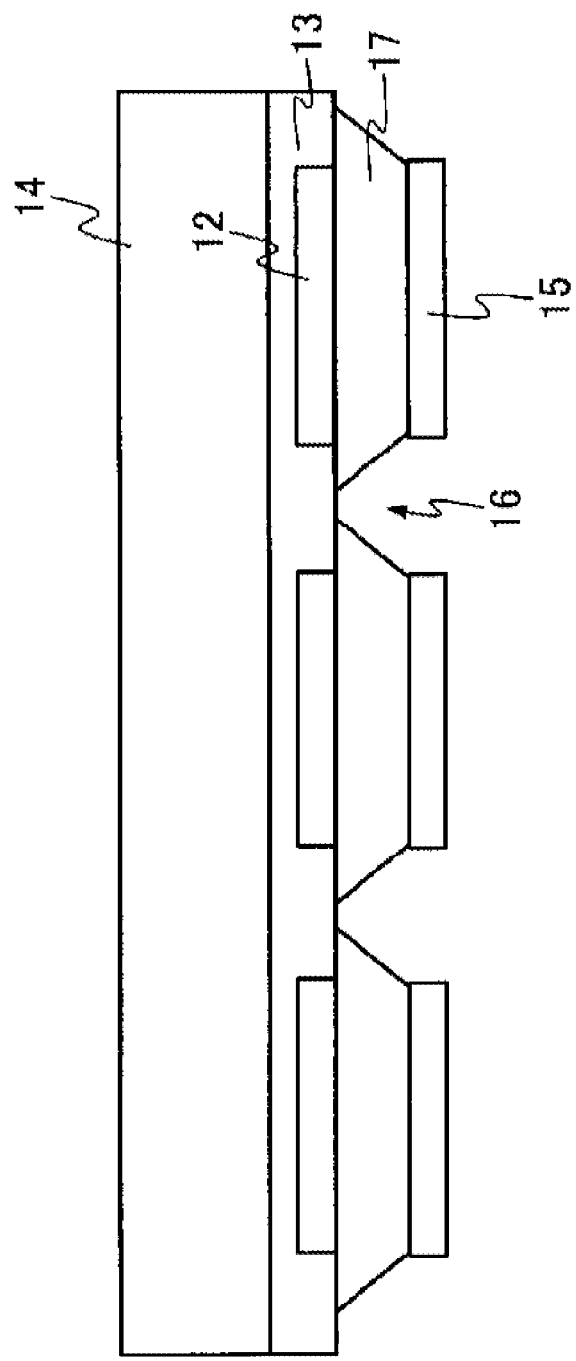
FIG. 5 is a cross-sectional view illustrating the method of manufacturing the semiconductor device according to Embodiment 1.

Then, as illustrated in FIG. 5, dry etching is performed using the resist mask 15 as a mask to remove a portion of the SiC wafer 11 which is exposed from the opening portion of the resist mask 15, and a groove 16 with a substantially V shape (hereinafter, referred to as a V groove) is formed in the SiC wafer 11. The angle formed between the front surface of the SiC wafer 11 and the side wall of the V groove 16 may be, for example, equal to or more than 40° and equal to or less than 80° and preferably, for example, about 55°.

In this case, it is preferable that the V groove 16 pass through the SiC wafer 11 and reach the adhesive layer 13 such that the SiC wafer 11 can be cut into each chip 17. In this way, it is possible to cut the SiC wafer 11 into chips without performing a dicing process. Any method may be used to form the V groove 16 as long as it can form the groove passing through the SiC wafer 11. For example, dry etching or wet etching can be used. Here, each of the cut chips 17 becomes the n-type substrate 1 illustrated in FIG. 1.

Figure 6:
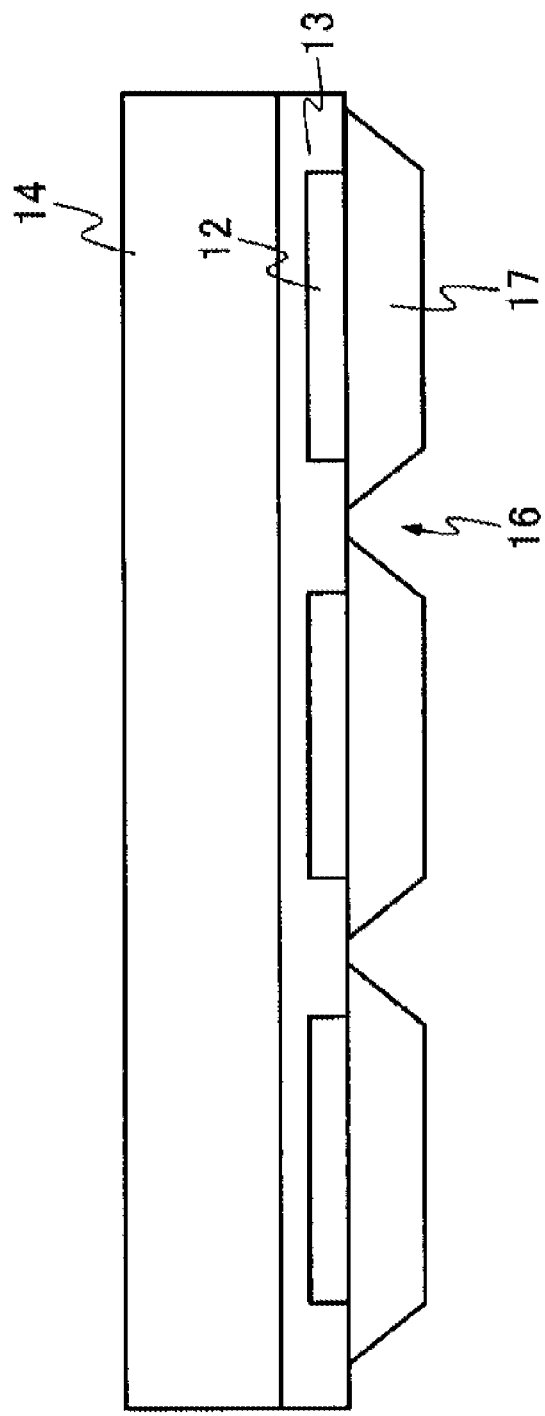
FIG. 6 is a cross-sectional view illustrating the method of manufacturing the semiconductor device according to Embodiment 1.
Figure 7:
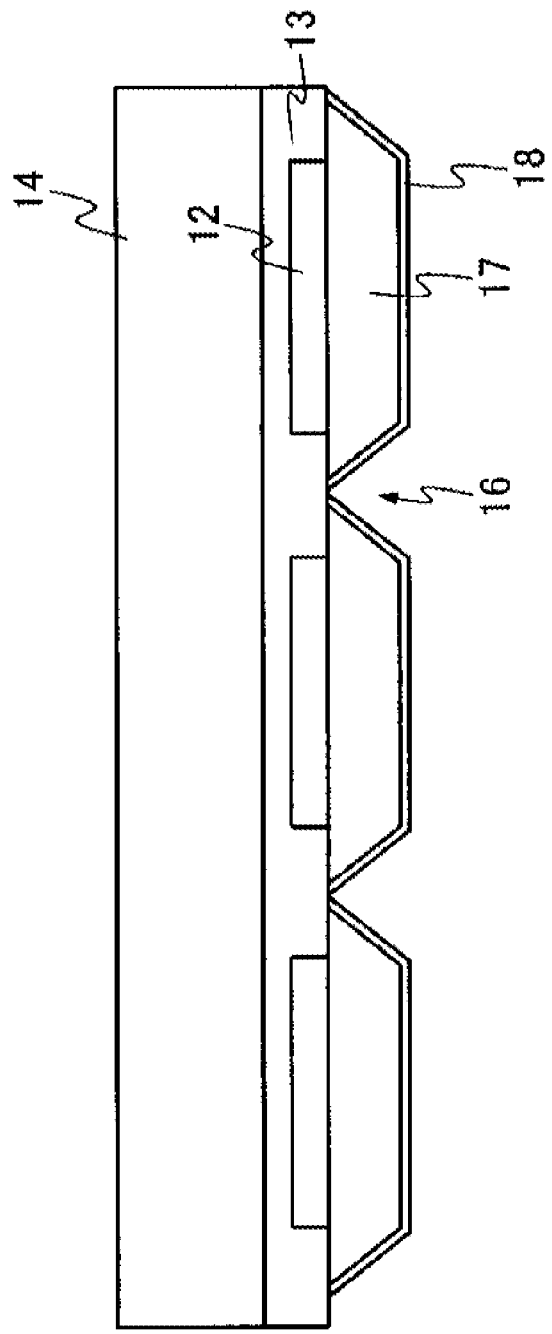
FIG. 7 is a cross-sectional view illustrating the method of manufacturing the semiconductor device according to Embodiment 1.

Then, as illustrated in FIG. 6, the resist mask 15 is removed. Then, as illustrated in FIG. 7, an electrode film 18 is formed on the side wall of the V groove 16 and the rear surface (a surface opposite to the surface on which the MOS gate structure 12 is formed) of the chip 17 and the Schottky junction between the drift layer, which is the chip 17, and the electrode film 18 is formed. The electrode film 18 may be a laminated film of, for example, nickel (Ni), platinum (Pt), titanium (Ti), and gold (Au). The electrode film 18 is the drain electrode 9 of the reverse blocking MOSFET illustrated in FIG. 1.

Then, in order to improve the adhesion of the electrode film 18 to the rear surface of the chip 17, the electrode film 18 is annealed at a temperature lower than the heatproof temperature of the adhesive layer 13. Specifically, furnace annealing may be performed for the chip 17 at a temperature of, for example, about 300° C. and laser annealing may be performed for the rear surface of the chip 17 to increase the temperature of the rear surface of the chip 17 to about 300° C.

Figure 8:
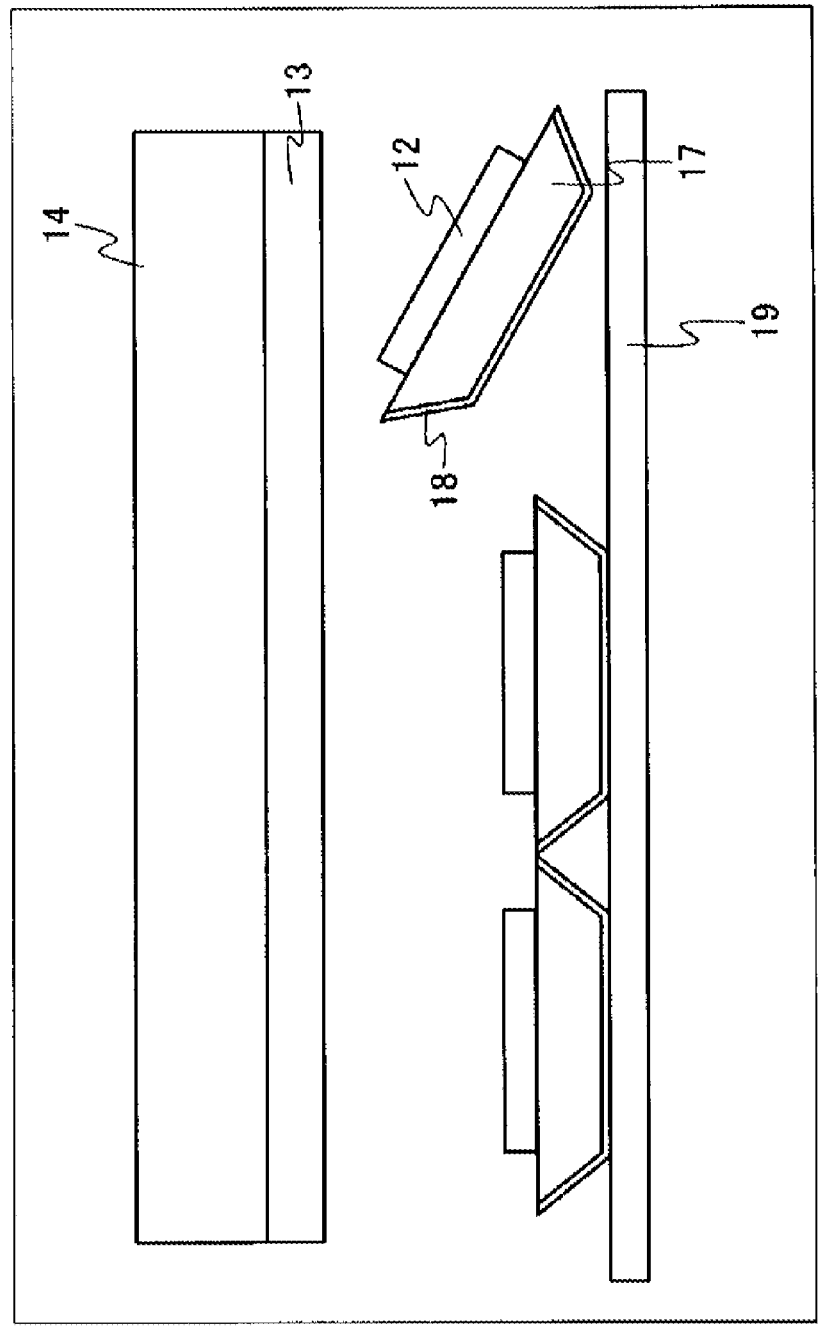
FIG. 8 is a cross-sectional view illustrating the method of manufacturing the semiconductor device according to Embodiment 1.

Then, as illustrated in FIG. 8, a tape 19 is bonded to the rear surface of the SiC wafer which has been cut into the chips 17 and the supporting substrate 14 peels off from each chip 17. In this case, the adhesive layer 13 is heated to weaken the adhesion of the adhesive layer 13 and then the supporting substrate 14 peels off (heating and peeling). In addition, after the interface between the supporting substrate 14 and the adhesive layer 13 is burned off with a laser, the supporting substrate 14 may peel off (laser radiation and peeling). In this way, all of the chips 17 are supported only by the tape 19.

Then, the chip 17 peels off from the tape 19 by, for example, pulling the tape 19 with both hands and expanding the tape 19. In this way, the chip 17 having the reverse blocking MOSFET illustrated in FIG. 1 formed therein is completed. A foaming peeling tape which loses adhesion when it is heated may be used as the tape 19. When the foaming peeling tape is used as the tape 19, it is easy for the tape 19 to peel off from the chip 17.

The bonding of the supporting substrate 14 to the SiC wafer 11 may be performed for a C (carbon) surface or a Si surface of the SiC wafer 11. In addition, when the reverse blocking MOSFET with a breakdown voltage of 600 V is manufactured, the final thickness t1 of the SiC wafer 11 may be, for example, about 10 μm.

As described above, according to Embodiment 1, the front surface element structure of the MOSFET is formed on the front surface of the n-type substrate 1 made of SiC and the Schottky junction between the n-type substrate 1 and the drain electrode 9 is formed on the side surface and the rear surface of the n-type substrate 1. In this way, it is possible to form the reverse blocking MOSFET. In addition, since SiC has a wider band gap than silicon and has stronger breakdown filed strength than silicon, it is possible to manufacture a reverse blocking MOSFET which has a low on-voltage and can perform a switching operation at a high speed, as compared to a case in which a Si wafer is used. Furthermore, it is possible to provide a reverse blocking MOSFET with a low built-in potential. Therefore, it is possible to form a reverse blocking MOSFET with low loss.

The V groove 16 is formed in the rear surface of the semiconductor wafer 11 which has been thinned, with the supporting substrate 14 bonded thereto, and then the electrode film 18 which will be the drain electrode 9 is formed. Therefore, even when the electrode film 18 is formed on the side wall of the V groove 16 and the rear surface of the semiconductor wafer 11 after the semiconductor wafer 11 is thinned, the semiconductor wafer is not broken or cracked. Therefore, it is possible to improve yield and manufacture a reverse blocking MOSFET at a high yield rate.

The V groove 16 is formed so as to pass through the semiconductor wafer 11 and reach the adhesive layer 13. Therefore, during a process of forming the reverse blocking MOSFET, it is possible to cut the semiconductor wafer into chips. In addition, the Schottky junction can be formed between the side surface and the rear surface of the chip, with the thinned semiconductor wafer cut into each chip.

In addition, the V groove 16 is formed such that the side surface of the chip has a tapered shape. Therefore, it is easy to form the electrode film 18 on the side surface of the chip, as compared to a case in which a trench with a side wall which is vertical to the rear surface of the semiconductor wafer 11 is formed. As a result, it is possible to manufacture a reverse blocking MOSFET at a high yield rate.

(Embodiment 2)

Figure 9:
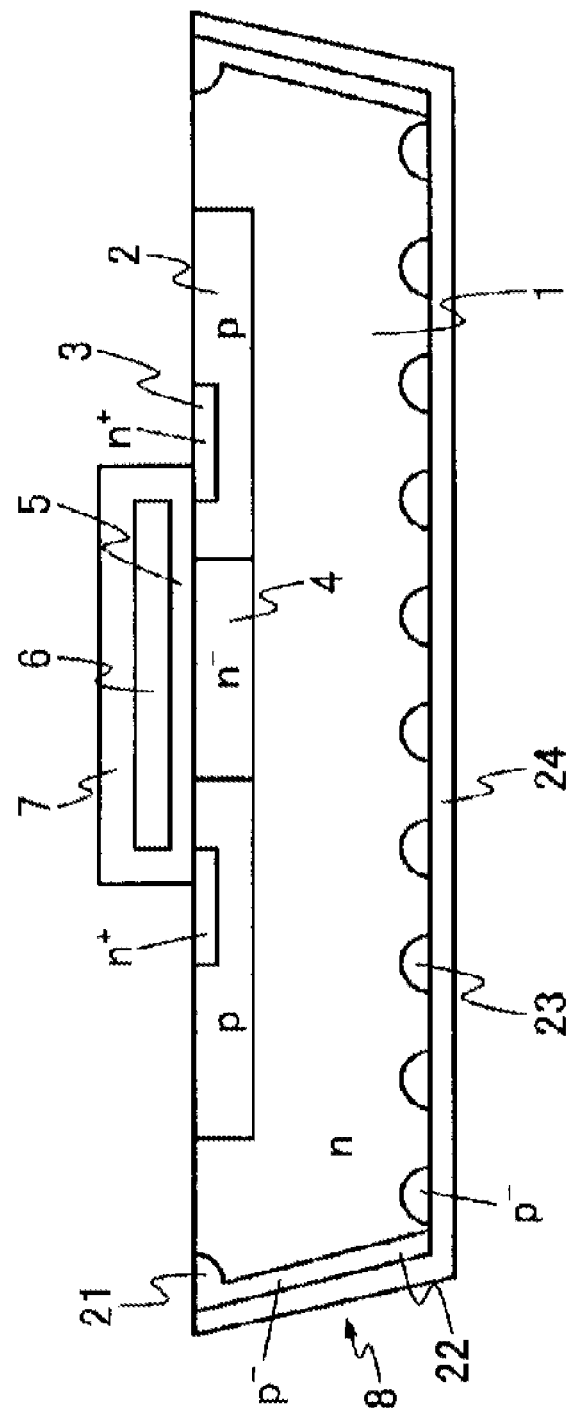
FIG. 9 is a cross-sectional view illustrating a semiconductor device according to Embodiment 2.

FIG. 9 is a cross-sectional view illustrating a semiconductor device according to Embodiment 2. The semiconductor device illustrated in FIG. 9 is a reverse blocking MOSFET. The reverse blocking MOSFET according to Embodiment 2 differs from the reverse blocking MOSFET according to Embodiment 1 in that a p⁻ semiconductor region is provided on the side surface 8 of the n-type substrate 1. In addition, a p⁻ semiconductor region is selectively provided in the rear surface of the n-type substrate 1.

In the reverse blocking MOSFET illustrated in FIG. 9, a MOS gate structure is provided on the front surface of the n-type substrate 1 which will be a drift layer, similarly to the reverse blocking MOSFET (FIG. 1) according to Embodiment 1. A p⁻ semiconductor region (hereinafter, referred to as FLR: field limiting ring) 21 is provided at the end of the front surface of the n-type substrate 1.

The side surface 8 of the n-type substrate 1 has a tapered shape, similarly to the reverse blocking MOSFET according to Embodiment 1. A p⁻ semiconductor region (hereinafter, referred to as a first semiconductor region serving as a separation layer) 22 which separates the drift layer and the side surface of the n-type substrate 1 is provided in a surface layer of the side surface 8 of the n-type substrate 1. The separation layer 22 comes into contact with the FLR 21. A p⁻ semiconductor region (hereinafter, referred to as a second semiconductor region serving as a p diffusion region) 23 is selectively provided in the rear surface of the n-type substrate 1.

A drain electrode 24 is provided on the rear surface and the tapered side surface 8 of the n-type substrate 1 so as to come into contact with the entire rear surface and the entire side surface 8 of the n-type substrate 1. The drain electrode 24 comes into contact with the separation layer 22 and the p diffusion region 23. The reverse blocking MOSFET according to Embodiment 2 have the same structure as the reverse blocking MOSFET according to Embodiment 1 except for the above.

Next, a method of manufacturing the reverse blocking MOSFET illustrated in FIG. 9 will be described. FIGS. 10 to 13 are cross-sectional views illustrating the method of manufacturing the semiconductor device according to Embodiment 2. Here, a case in which a reverse blocking MOSFET with a breakdown voltage of 1200 V is manufactured using an SiC wafer will be described.

First, as illustrated in FIGS. 2 to 5, similarly to Embodiment 1, a process of forming a MOS gate structure 12 to a process of forming a V groove 16 are performed. Specifically, the MOS gate structure 12 is formed on the front surface of the SiC wafer 11 (FIG. 2) and a supporting substrate 14 is bonded to the SiC wafer 11 through an adhesive layer 13 (FIG. 3). Then, the SiC wafer 11 is thinned and a resist mask 15 in which a region corresponding to the V groove 16 is opened is formed on the rear surface of the SiC wafer 11 (FIG. 4). Etching is performed using the resist mask 15 as a mask to form the V groove 16 and the SiC wafer 11 is cut into chips 17 (FIG. 5).

In Embodiment 2, when the MOS gate structure 12 is formed on the front surface of the SiC wafer, the FLR 21 (see FIG. 9; not illustrated in FIGS. 10 to 13) is formed together with the MOS gate structure 12. The FLR 21 may be formed in the same process as that for forming the p⁻ region forming the MOS gate structure 12, or it may be formed separately from each region forming the MOS gate structure 12.

Figure 10:
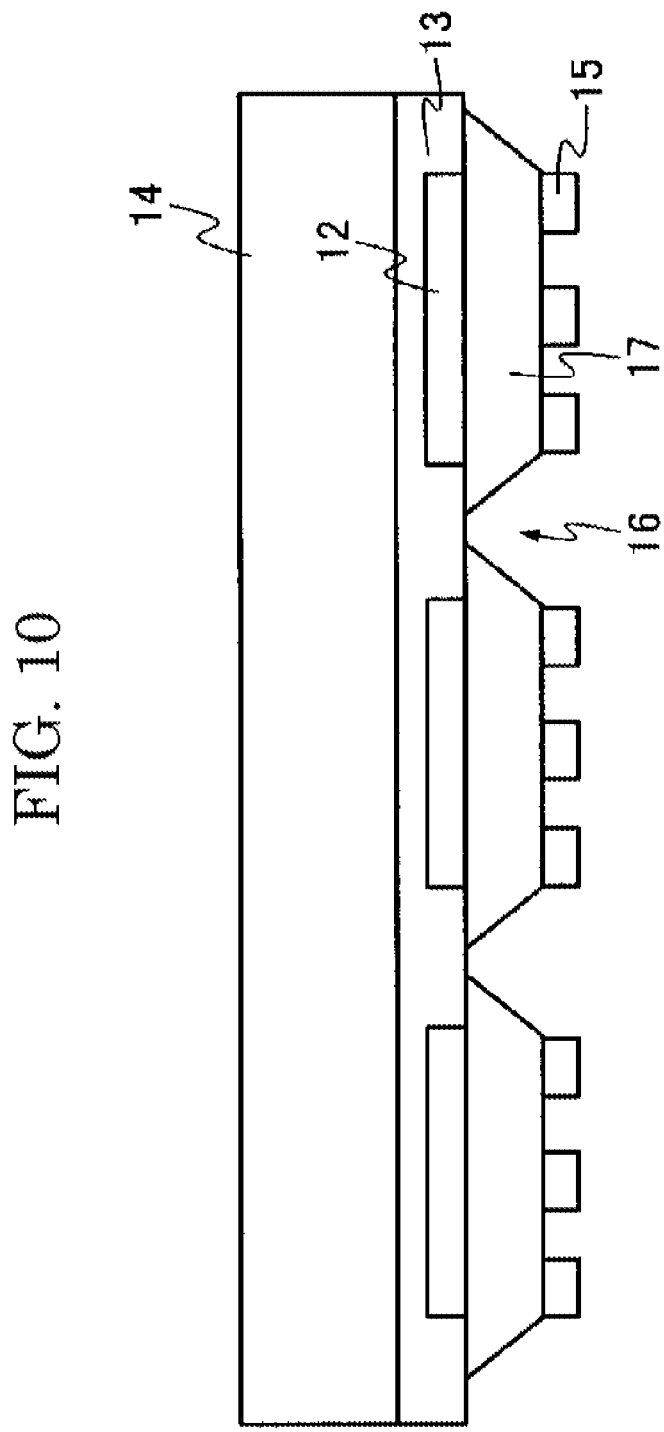
FIG. 10 is a cross-sectional view illustrating a method of manufacturing the semiconductor device according to Embodiment 2.

Then, as illustrated in FIG. 10, the resist mask 15 is patterned again by photolithography and an opening portion corresponding to the p diffusion region 23 (see FIG. 9) formed in the rear surface of the chip 17 is formed in the resist mask 15.

Figure 11:
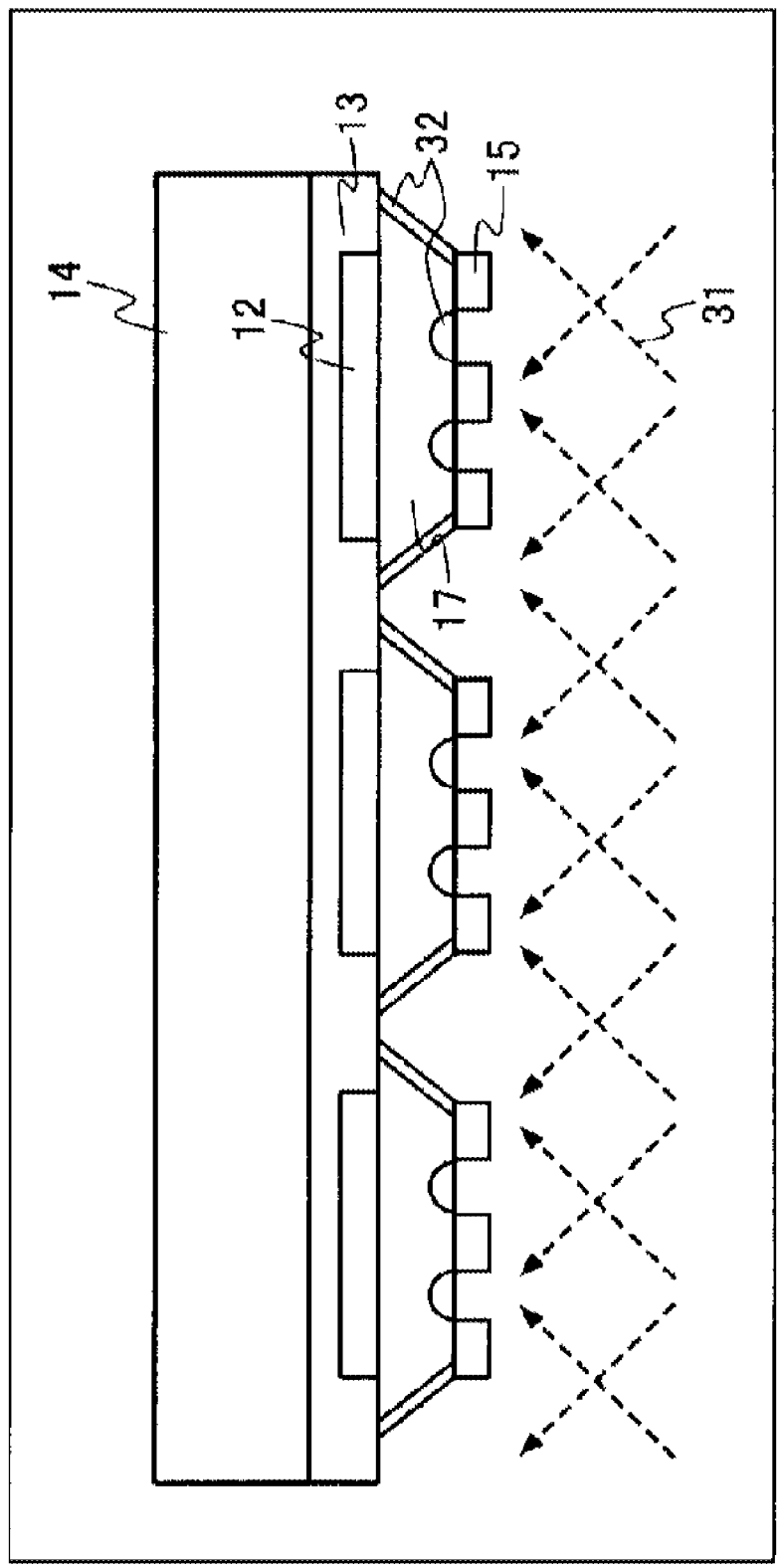
FIG. 11 is a cross-sectional view illustrating the method of manufacturing the semiconductor device according to Embodiment 2.

Then, as illustrated in FIG. 11, p-type impurity ions (for example, aluminum ions: Al⁺) are implanted into the rear surface of the chip 17 using the resist mask 15 as a mask (ion implantation 31). In this case, for example, it is preferable that the ion implantation 31 be performed in an oblique direction with respect to the rear surface of the chip 17. In addition, it is preferable to perform the ion implantation 31 while heating the chip 17 at a temperature of 300° C. to 380° C. lower than the heatproof temperature of the adhesive layer 13.

Figure 12:
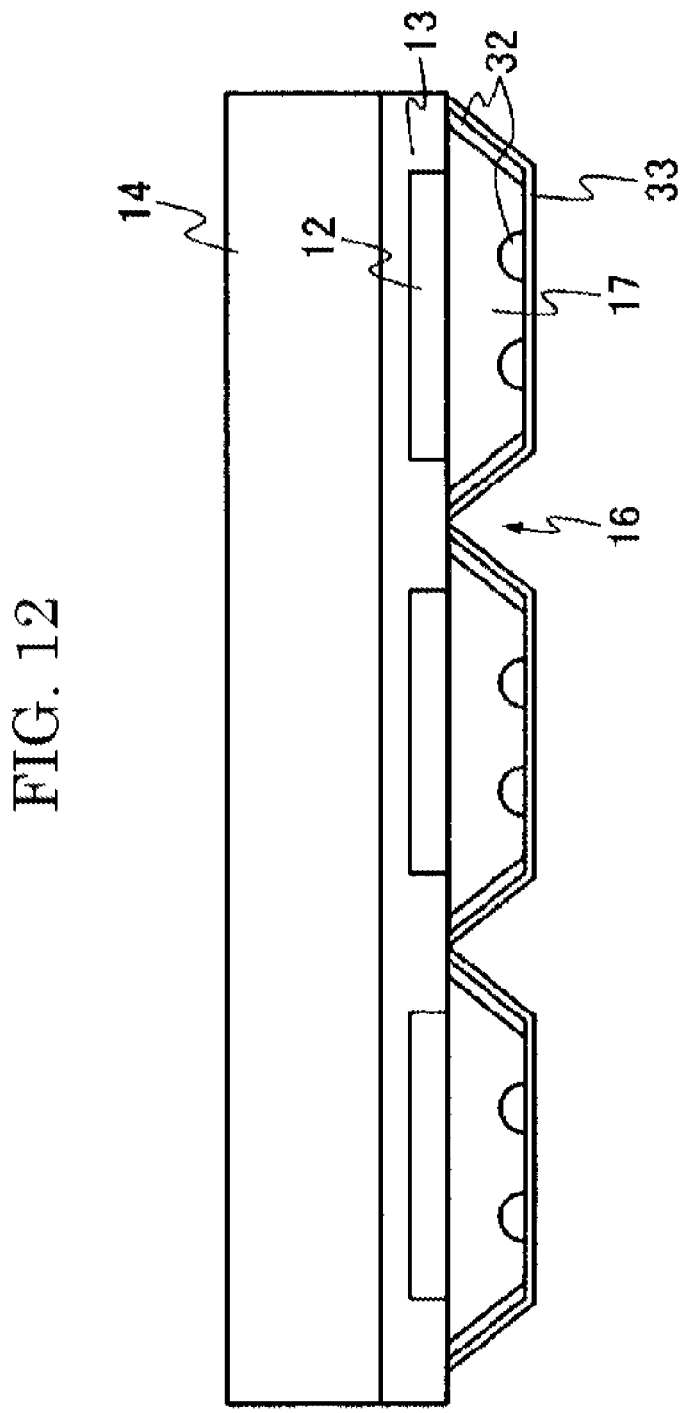
FIG. 12 is a cross-sectional view illustrating the method of manufacturing the semiconductor device according to Embodiment 2.

Then, as illustrated in FIG. 12, after the resist mask 15 is removed, the p-type impurities implanted into the side wall of the V groove 16 and the rear surface of the chip 17 are activated by laser annealing. It is preferable that the laser annealing be performed by a YAG3ω (=355 nm) laser, a XeF (=351 nm) laser, or a XeCl (=308 nm) laser in order to improve the absorption of laser beams to the SiC substrate. Then, a p⁻ semiconductor region 32 (the separation layer 22 and the p diffusion region 23 illustrated in FIG. 9) is formed on the side wall of the V groove 16 and the rear surface of the chip 17. In this case, the p⁻ semiconductor region 32 (p diffusion region 23) formed on the rear surface of the chip 17 is formed by the pattern of the resist mask 15 used in the ion implantation 31.

Figure 13:
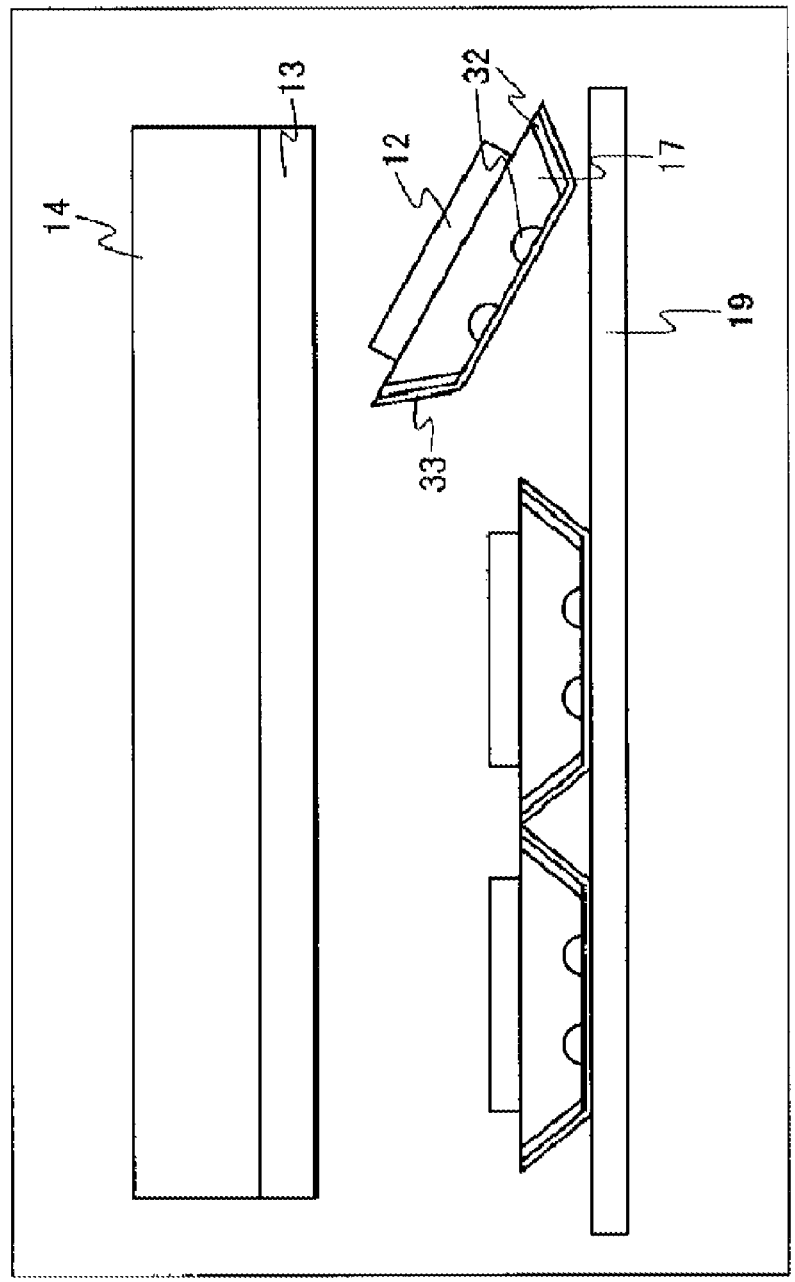
FIG. 13 is a cross-sectional view illustrating the method of manufacturing the semiconductor device according to Embodiment 2.

Then, as a pre-process for forming an electrode film which will be the drain electrode 24 (see FIG. 9) of the reverse blocking MOSFET, the side wall of the V groove 16 and the rear surface of the chip 17 are cleaned by hydrofluoric acid (not illustrated). Then, as illustrated in FIG. 12, an electrode film 33, which is a laminated film of, for example, Ti and Au, is formed on the side wall of the V groove 16 and the rear surface of the chip 17. Then, an electrode annealing process for improving the adhesion of the electrode film 33 and the subsequent processes are performed in the same manner as that in Embodiment 1. As illustrated in FIG. 13, the chip 17 peels off from the tape 19. In this way, the chip 17 in which the reverse blocking MOSFET illustrated in FIG. 9 is formed is completed.

As described above, according to Embodiment 2, it is possible to obtain the same effect as that in Embodiment 1. In addition, the p diffusion region 23 which is selectively formed in the rear surface of the semiconductor wafer 11 makes it possible to reduce the leakage current of the reverse blocking MOSFET.

(Embodiment 3)

Figure 14:
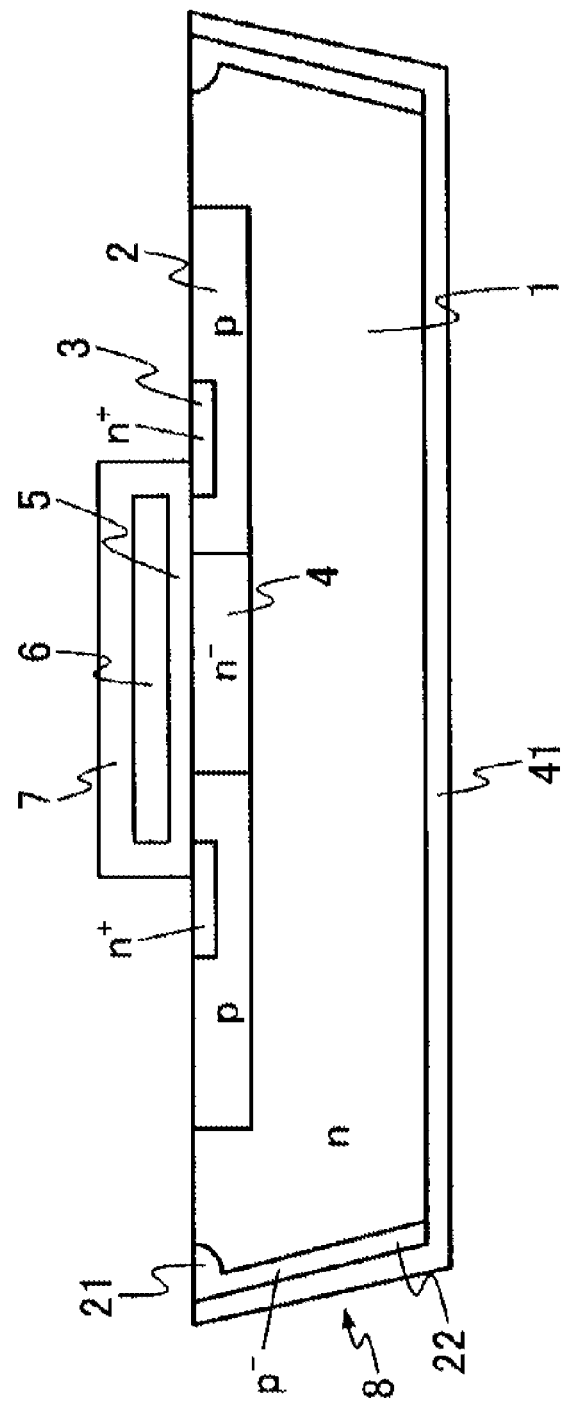
FIG. 14 is a cross-sectional view illustrating a semiconductor device according to Embodiment 3.

FIG. 14 is a cross-sectional view illustrating a semiconductor device according to Embodiment 3. The semiconductor device illustrated in FIG. 14 is a reverse blocking MOSFET. The reverse blocking MOSFET illustrated in FIG. 14 differs from the reverse blocking MOSFET according to Embodiment 2 in that the p$^-$ semiconductor region is provided only in the side surface 8 of the n-type substrate 1. That is, in the reverse blocking MOSFET according to Embodiment 3, the p diffusion region is not provided in the rear surface of the n-type substrate 1.

In the reverse blocking MOSFET illustrated in FIG. 14, the side surface 8 of the n-type substrate 1 has a tapered shape, similarly to the reverse blocking MOSFET according to Embodiment 1. A p$^-$ separation layer 22 which comes into contact with an FLR 21 is provided on the side surface 8 of the n-type substrate 1.

A drain electrode 41 is provided on the rear surface and the tapered side surface 8 of the n-type substrate 1 and so as to come into contact with the entire rear surface and the entire side surface 8 of the n-type substrate 1. The drain electrode 41 comes into contact with the separation layer 22. In addition, the Schottky junction between the n-type substrate 1 and the drain electrode 41 is formed in the rear surface of the n-type substrate 1. The reverse blocking MOSFET according to Embodiment 3 has the same structure as the reverse blocking MOSFET according to Embodiment 2 except for the above.

Next, a method of manufacturing the reverse blocking MOSFET illustrated in FIG. 14 will be described. The method of manufacturing the reverse blocking MOSFET illustrated in FIG. 14 differs from the method of manufacturing the reverse blocking MOSFET according to Embodiment 2 in that a p$^-$ semiconductor region 32 is formed only in a surface layer of the side wall of a V groove 16. Specifically, in Embodiment 3, the process of patterning the resist mask 15 for forming the p-semiconductor region 32 in the rear surface of the chip 17 two times (see FIG. 10) in Embodiment 2 is not performed and ion implantation 31 and laser annealing are performed only for the side wall of the V groove 16. The method of manufacturing the reverse blocking MOSFET according to Embodiment 3 is the same as the method of manufacturing the reverse blocking MOSFET according to Embodiment 2 except for the above.

As described above, according to Embodiment 3, it is possible to obtain the same effect as that in Embodiment 2. In Embodiment 3, since laser annealing is performed only for the side wall of the V groove 16, the annealing temperature can be set to a high temperature to sufficiently activate the p-type impurities implanted into the side wall of the V groove 16.

(Embodiment 4)

Figure 15:
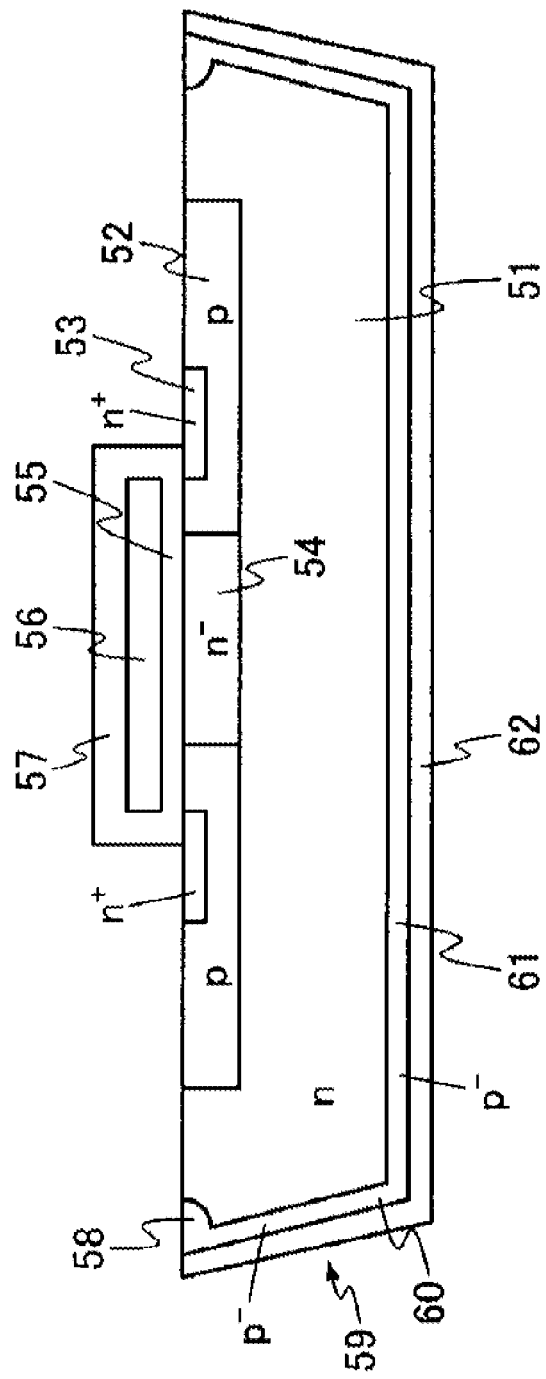
FIG. 15 is a cross-sectional view illustrating a semiconductor device according to Embodiment 4.

FIG. 15 is a cross-sectional view illustrating a semiconductor device according to Embodiment 4. The semiconductor device illustrated in FIG. 15 is a reverse blocking IGBT. In the reverse blocking IGBT illustrated in FIG. 15, a MOS gate structure including a p base region 52, an n$^+$ emitter region 53, an n$^-$ contact region 54, a gate insulating film 55, a gate electrode 56, and an interlayer insulating film 57 is provided on the front surface of an n-type substrate 51 which will be a drift layer. In addition, a p$^-$ FLR 58 is provided at the end of the front surface of the n-type substrate 51.

A side surface 59 of the n-type substrate 51 has a tapered shape, similarly to the reverse blocking MOSFET according to Embodiment 1. Specifically, the side surface 59 of the n-type substrate 51 is inclined such that the width of the n-type substrate 51 gradually increases from the collector side (the rear surface side of the n-type substrate 51) to the emitter side (the front surface side of the n-type substrate 51).

A p$^-$ separation layer 60 is provided in a surface layer of the side surface 59 of the n-type substrate 51. The separation layer 60 comes into contact with the FLR 58. A p$^-$ collector region (third semiconductor region) 61 is provided in the rear surface of the n-type substrate 51. The collector region 61 comes into contact with the separation layer 60. That is, the FLR 58, the separation layer 60, and the collector region 61 are connected to one another.

A collector electrode 62 is provided on the rear surface and the tapered side surface 59 of the n-type substrate 51. That is, the collector electrode 62 comes into contact with the separation layer 60 and the collector region 61. In the rear surface and the side surface 59 f the n-type substrate 51, the Schottky junction is formed between a p-type region including the separation layer 60 and the collector region 61 and the collector electrode 62. Since the separation layer 60 is formed on the side surface 59 of the n-type substrate 51, the reverse blocking IGBT illustrated in FIG. 15 maintains the reverse voltage when the reverse voltage is applied. The n-type substrate 51 has the same structure as the n-type substrate 1 of the reverse blocking MOSFET according to Embodiment 1 except for the above.

Next, a method of manufacturing the reverse blocking IGBT illustrated in FIG. 15 will be described. FIGS. 16 to 23 are cross-sectional views illustrating the method of manufacturing the semiconductor device according to Embodiment 4. First, as illustrated in FIGS. 16 to 20, a process of forming a MOS gate structure 72 of the reverse blocking IGBT to a process of removing a resist mask 75 used to a V groove 76 after the V groove 76 is formed are the same as those in Embodiment 1.

Figure 16:
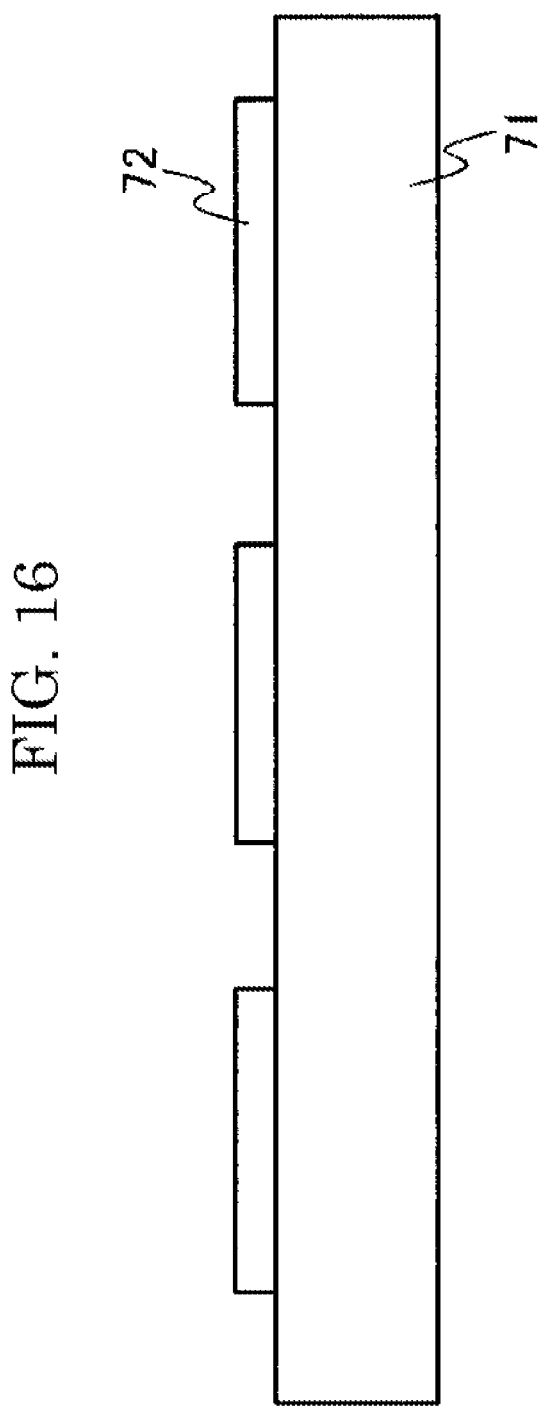
FIG. 16 is a cross-sectional view illustrating a method of manufacturing the semiconductor device according to Embodiment 4.
Figure 17:
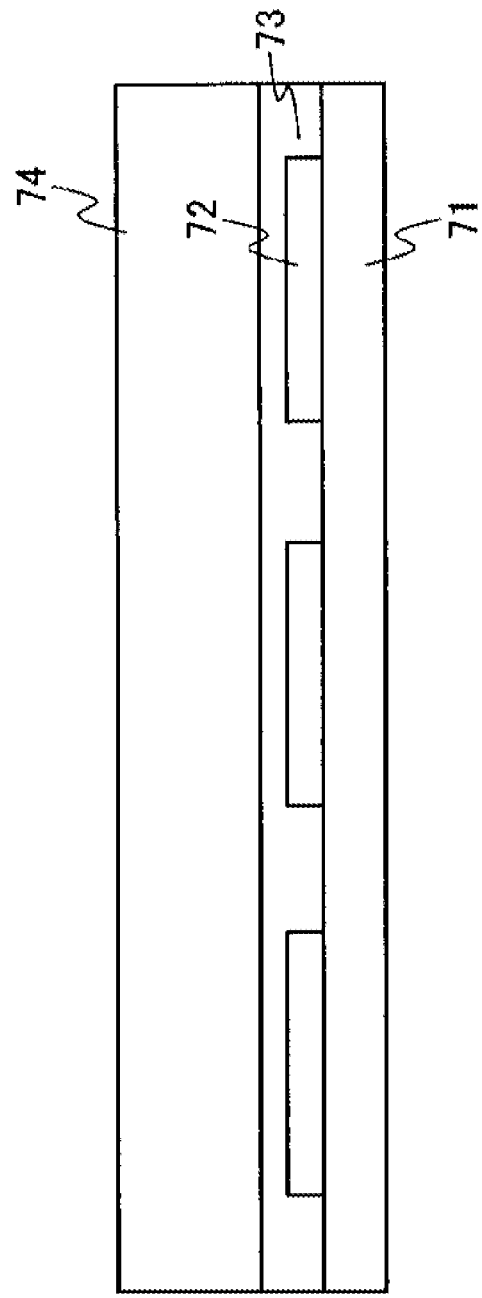
FIG. 17 is a cross-sectional view illustrating the method of manufacturing the semiconductor device according to Embodiment 4.
Figure 18:
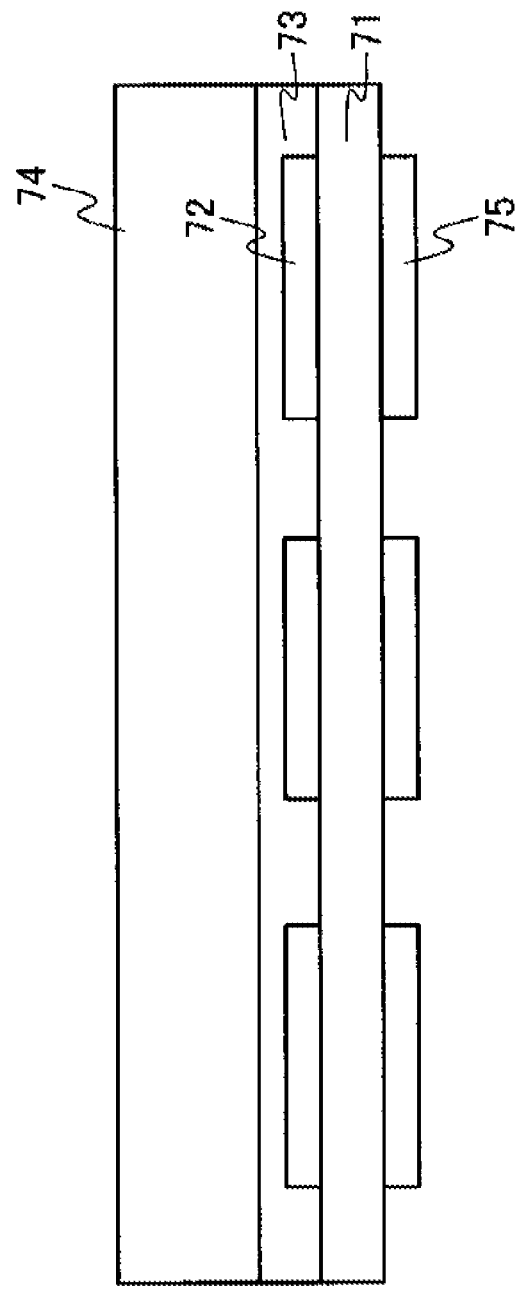
FIG. 18 is a cross-sectional view illustrating the method of manufacturing the semiconductor device according to Embodiment 4.
Figure 19:
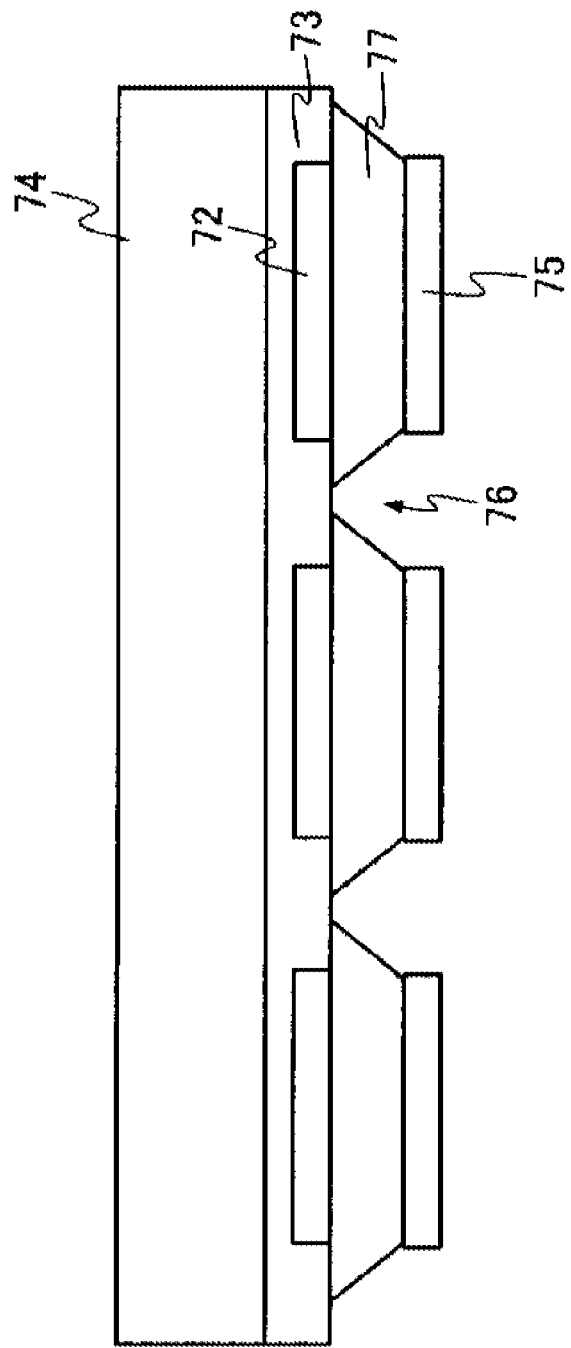
FIG. 19 is a cross-sectional view illustrating the method of manufacturing the semiconductor device according to Embodiment 4.
Figure 20:
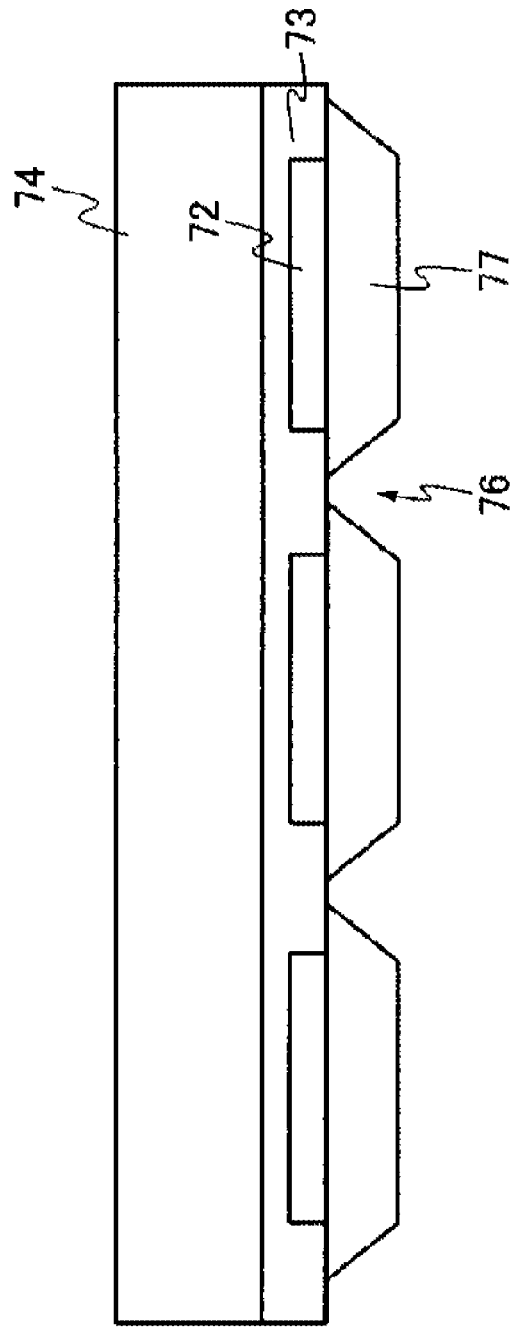
FIG. 20 is a cross-sectional view illustrating the method of manufacturing the semiconductor device according to Embodiment 4.

Specifically, the MOS gate structure 72 of the reverse blocking IGBT is formed on the front surface of an SiC wafer 71 (FIG. 16). Then, a supporting substrate 74 is bonded to the SiC wafer 71 through an adhesive layer 73 (FIG. 17). Then, the SiC wafer 71 is thinned and the resist mask 75 in which a region corresponding to the V groove 76 is opened is formed on the rear surface of the SiC wafer 71 (FIG. 18). Then, etching is performed using the resist mask 75 as a mask to form the V groove 76 and the SiC wafer 71 is cut into individual chips 77 (FIG. 19). Then, the resist mask 75 is removed (FIG. 20). Here, the adhesive layer 73 and the supporting substrate 74 have the same structure as the adhesive layer and the supporting substrate used to form the reverse blocking MOSFET according to Embodiment 1.

In Embodiment 4, when the MOS gate structure 72 is formed on the front surface of the SiC wafer 71, the FLR 58 (see FIG. 15; not illustrated in FIGS. 16 to 23) is formed together with the MOS gate structure 72. The FLR 58 may be formed in the same process as that for forming the p⁻ region of the MOS gate structure 72 or it may be formed separately from each region of the MOS gate structure 72.

Figure 21:
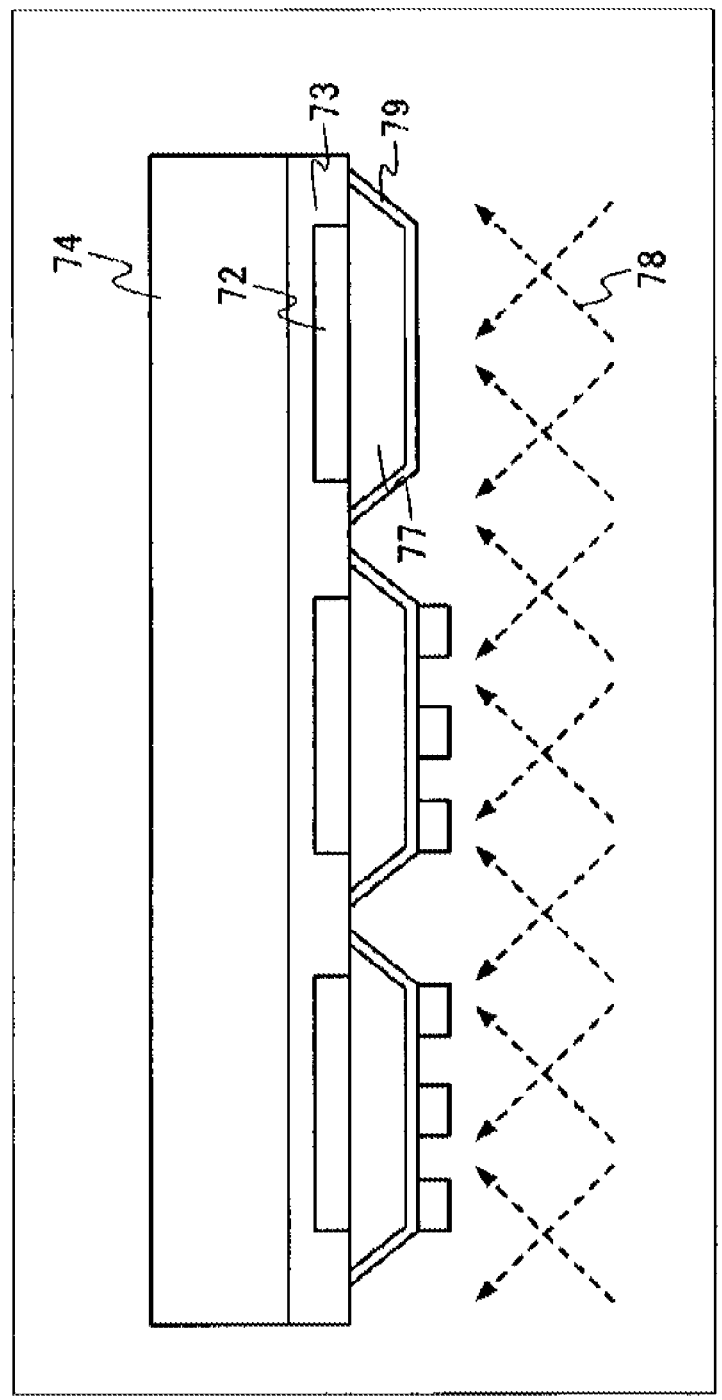
FIG. 21 is a cross-sectional view illustrating the method of manufacturing the semiconductor device according to Embodiment 4.

Then, as illustrated in FIG. 21, p-type impurity ions (for example, aluminum ions: Al⁺) are implanted into the rear surface of the chip 77 (ion implantation 78). In this case, for example, it is preferable that the ion implantation 78 be performed in an oblique direction with respect to the rear surface of the chip 77. In addition, it is preferable to perform the ion implantation 78 while heating the chip 77 at a temperature of 300° C. to 380° C. lower than the heatproof temperature of the adhesive layer 73.

Then, the p-type impurities which are implanted into the side wall of the V groove 76 and the rear surface of the chip 77 by the ion implantation 78 are activated by laser annealing. It is preferable that the laser annealing be performed by a YAG3ω (=355 nm) laser, a XeF (=351 nm) laser, or a XeCl (=308 nm) laser in order to improve the absorption of laser beams to the SiC substrate. Then, a p⁻ semiconductor region 79 (the separation layer 60 and the collector region 61 illustrated in FIG. 15) is formed on the entire side wall of the V groove 76 and the entire rear surface of the chip 77. A temperature of 1000° C. or more is required to activate the impurities in the SiC substrate. However, when the laser annealing is used, the substrate can be partially heated at a temperature of 1000° C. or more and the p⁻ semiconductor region 79 which is to be activated and is formed at a depth of several micrometers can be sufficiently activated.

Figure 22:
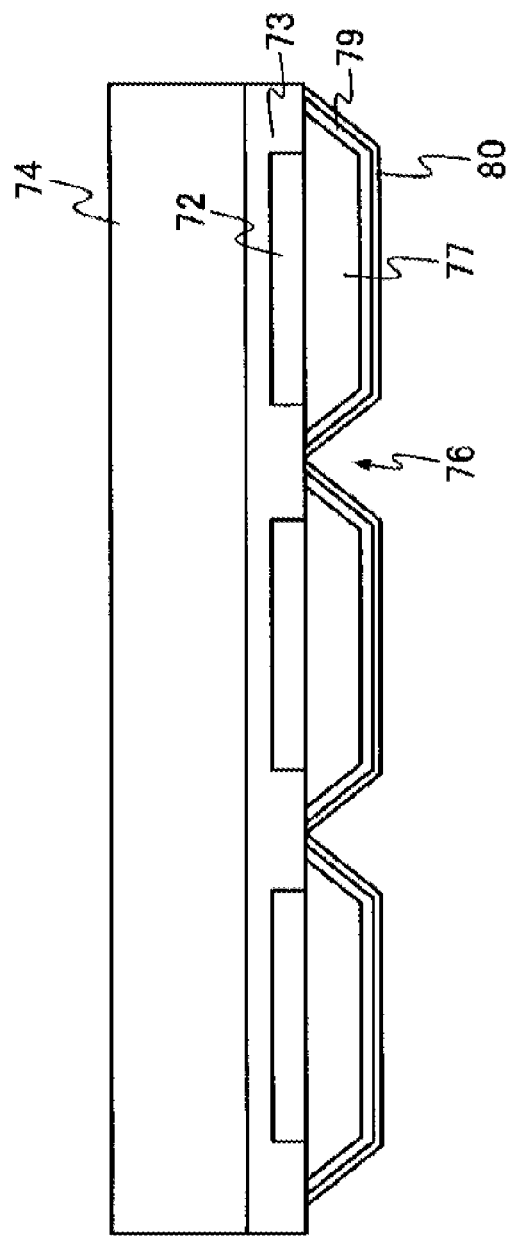
FIG. 22 is a cross-sectional view illustrating the method of manufacturing the semiconductor device according to Embodiment 4.
Figure 23:
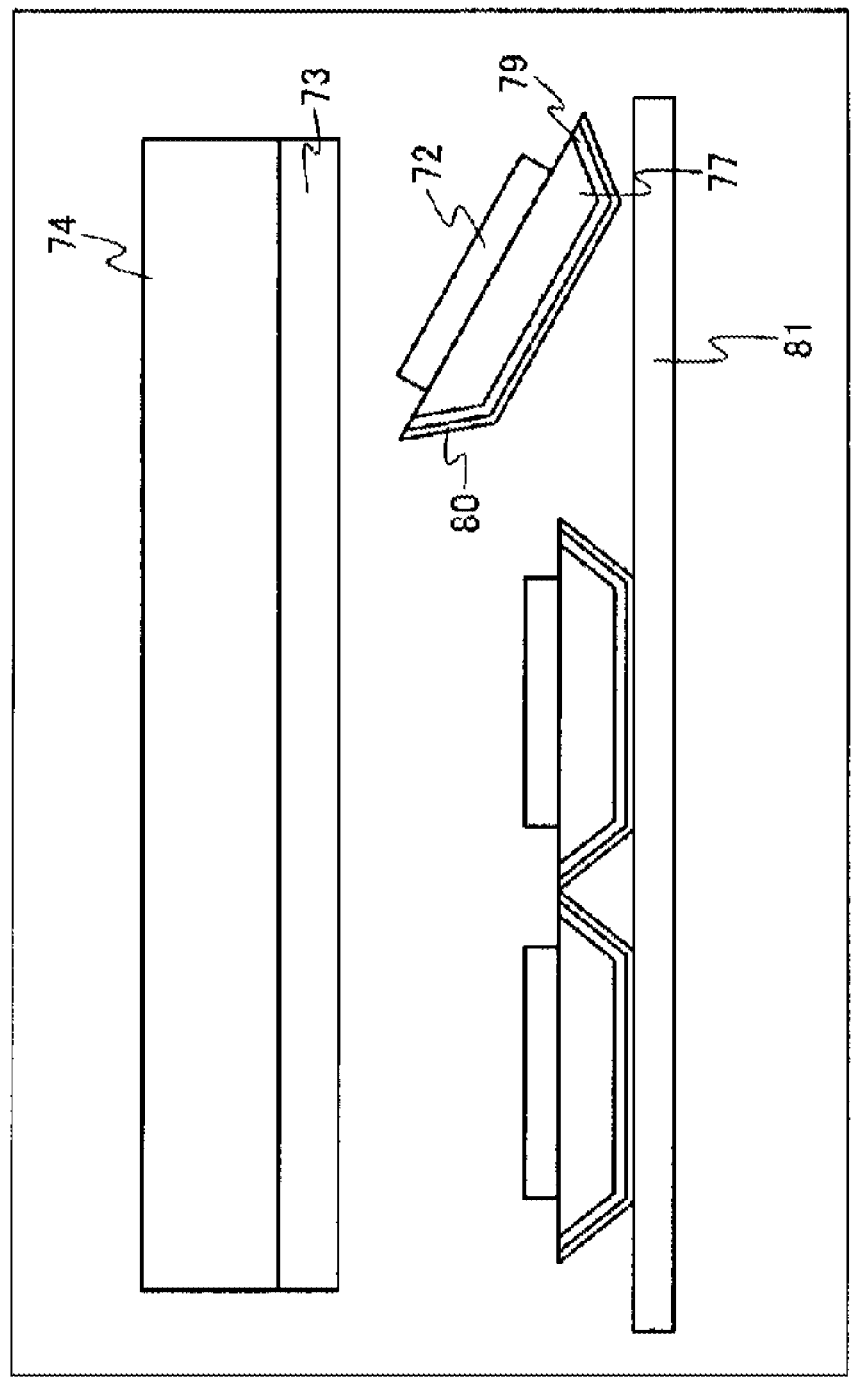
FIG. 23 is a cross-sectional view illustrating the method of manufacturing the semiconductor device according to Embodiment 4.

Then, as a pre-process for forming an electrode film which will be the collector electrode 62 (see FIG. 15) of the reverse blocking IGBT, the side wall of the V groove 76 and the rear surface of the chip 77 are cleaned by hydrofluoric acid (not illustrated). Then, as illustrated in FIG. 22, an electrode film 80, which is a laminated film of, for example, Ti and Au, is formed on the side wall of the V groove 76 and the rear surface of the chip 77. Then, an electrode annealing process for improving the adhesion of the electrode film 80 and the subsequent processes are performed in the same manner as that in Embodiment 1. As illustrated in FIG. 23, the chip 77 peels off from a tape 81. In this way, the chip 77 in which the reverse blocking IGBT illustrated in FIG. 15 is formed is completed.

As described above, according to Embodiment 4, it is possible to manufacture a reverse blocking IGBT having the same effect as the reverse blocking MOSFET according to Embodiment 1.

(Embodiment 5)

Figure 24:
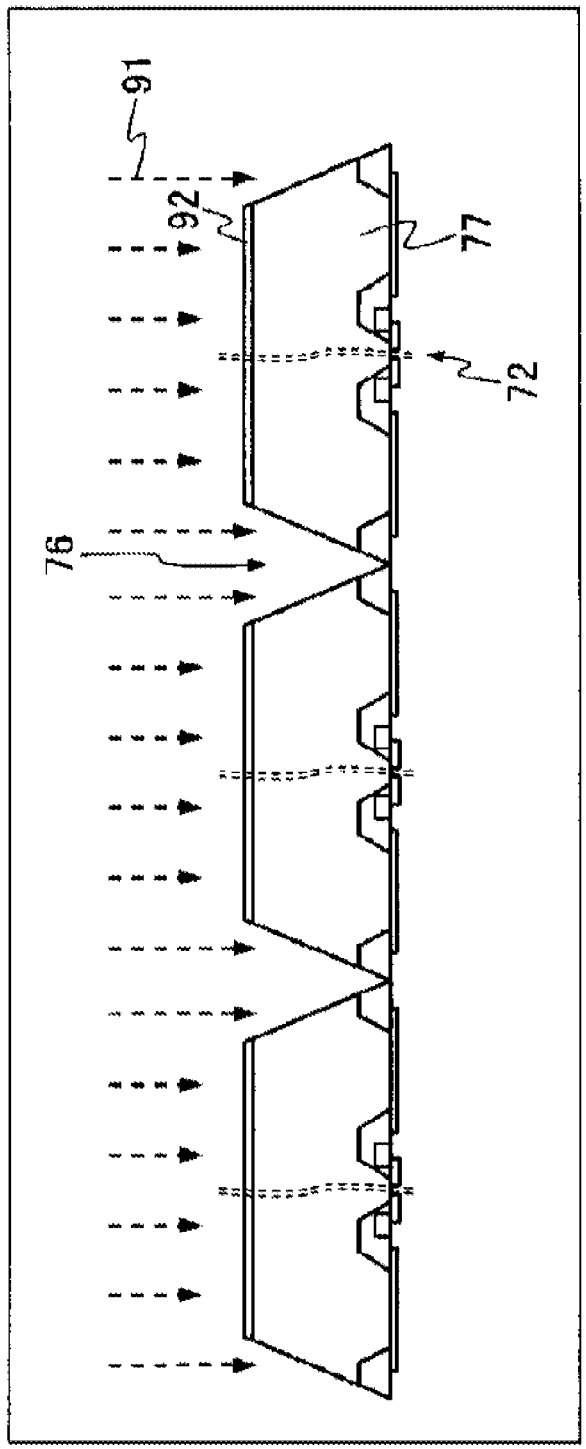
FIG. 24 is a cross-sectional view illustrating a method of manufacturing a semiconductor device according to Embodiment 5.
Figure 25:
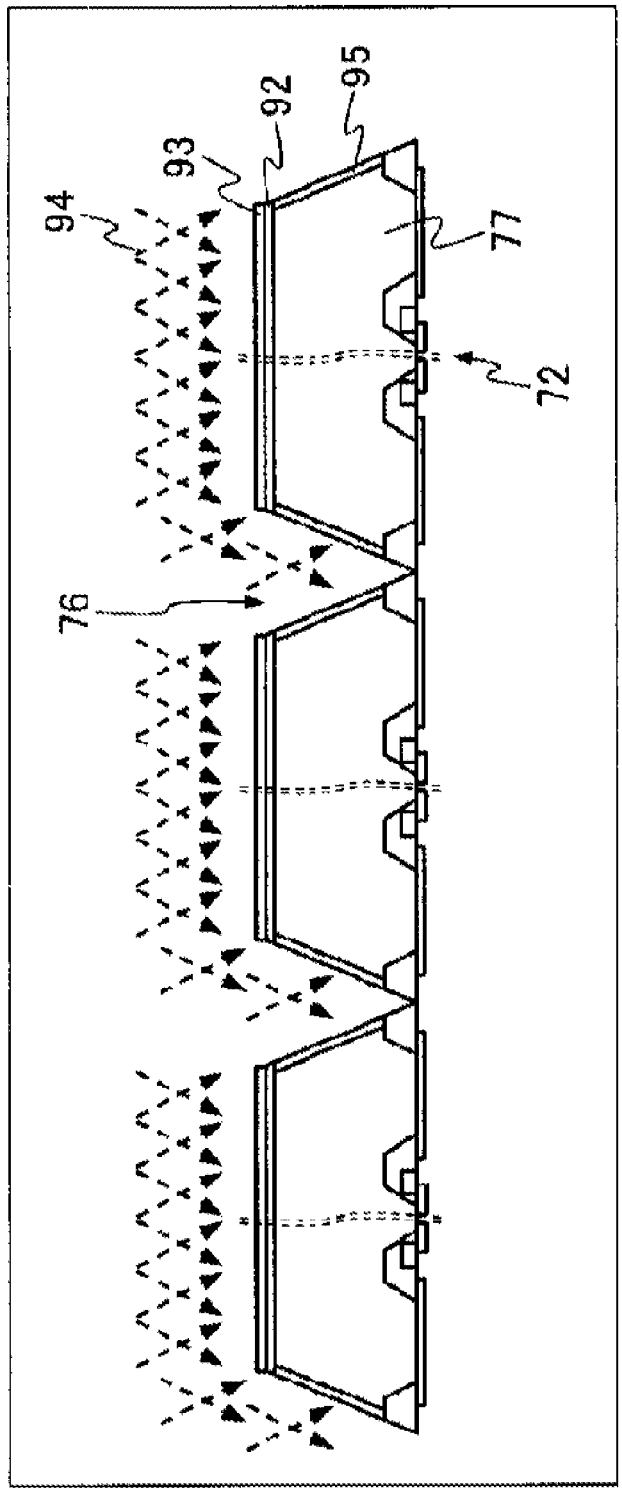
FIG. 25 is a cross-sectional view illustrating the method of manufacturing the semiconductor device according to Embodiment 5.

FIGS. 24 and 25 are cross-sectional views illustrating a method of manufacturing a semiconductor device according to Embodiment 5. Another example of the method of manufacturing the reverse blocking IGBT according to Embodiment 4 will be described with reference to FIGS. 24 and 25. In Embodiment 5, the ion implantation 78 and the annealing (see FIG. 21) which are simultaneously performed for the side surface and the rear surface of the chip 77 in Embodiment 4 may be divided into ion implantation and annealing for forming a separation layer on a surface layer of the side surface of the chip 77 and ion implantation and annealing for forming a collector region in the rear surface of the chip 77.

In Embodiment 5, as illustrated in FIGS. 16 to 20, the process of forming the MOS gate structure 72 of the reverse blocking IGBT to the process of removing the resist mask 75 used to form the V groove 76 after the V groove 76 are performed in the same manner as that in Embodiment 4.

Then, as illustrated in FIG. 24, p-type impurity ions (for example, aluminum ions: Al⁺) are implanted into the rear surface of the chip 77 (ion implantation 91) to form a p⁻ semiconductor region 92 (the collector region 61 illustrated in FIG. 15) on the entire rear surface of the chip 77. In this case, for example, the ion implantation 91 is performed in a direction perpendicular to the rear surface of the chip 77. Then, laser annealing is performed for the rear surface of the chip 77 to activate the p-type impurities implanted into the rear surface of the chip 77, similarly to Embodiment 4. Then, the p⁻ semiconductor region 92 is formed in the surface layer of the rear surface of the chip 77.

Then, as illustrated in FIG. 25, a resist mask 93 which covers the p⁻ semiconductor region 92 is formed on the rear surface of the chip 77. The side wall of the V groove 76 is exposed through an opening portion of the resist mask 93. Then, p-type impurity ions (for example, aluminum ions: Al⁺) are implanted into the rear surface of the chip 77 (ion implantation 94). In this case, for example, the ion implantation 94 is performed in an oblique direction with respect to the rear surface of the chip 77.

Then, similarly to Embodiment 4, laser annealing is performed to activate the p-type impurities implanted into the side wall of the V groove 76. Then, a p⁻ semiconductor region 95 (the separation layer 60 illustrated in FIG. 15) is formed in a surface layer of the side wall of the V groove 76. Then, a pre-process for forming an electrode film which will be the collector electrode 62 (see FIG. 15) of the reverse blocking IGBT and the subsequent processes are performed in the same manner as that in Embodiment 4. In this way, the chip 77 in which the reverse blocking IGBT illustrated in FIG. 15 is formed is completed.

The conditions of the ion implantation 91 and the ion implantation 94 may be the same as those of the ion implantation 78 (see FIG. 21) in Embodiment 4. In addition, the ion implantation 91 and the ion implantation 94 may be performed under different conditions.

In the above-mentioned process, after the p⁻ semiconductor region 92 is formed, the p⁻ semiconductor region 95 is formed. However, after the p⁻ semiconductor region 95 is formed, the p⁻ semiconductor region 92 may be formed.

As described above, according to Embodiment 5, it is possible to obtain the same effect as that in Embodiment 4.

EXAMPLE 1

Figure 26:
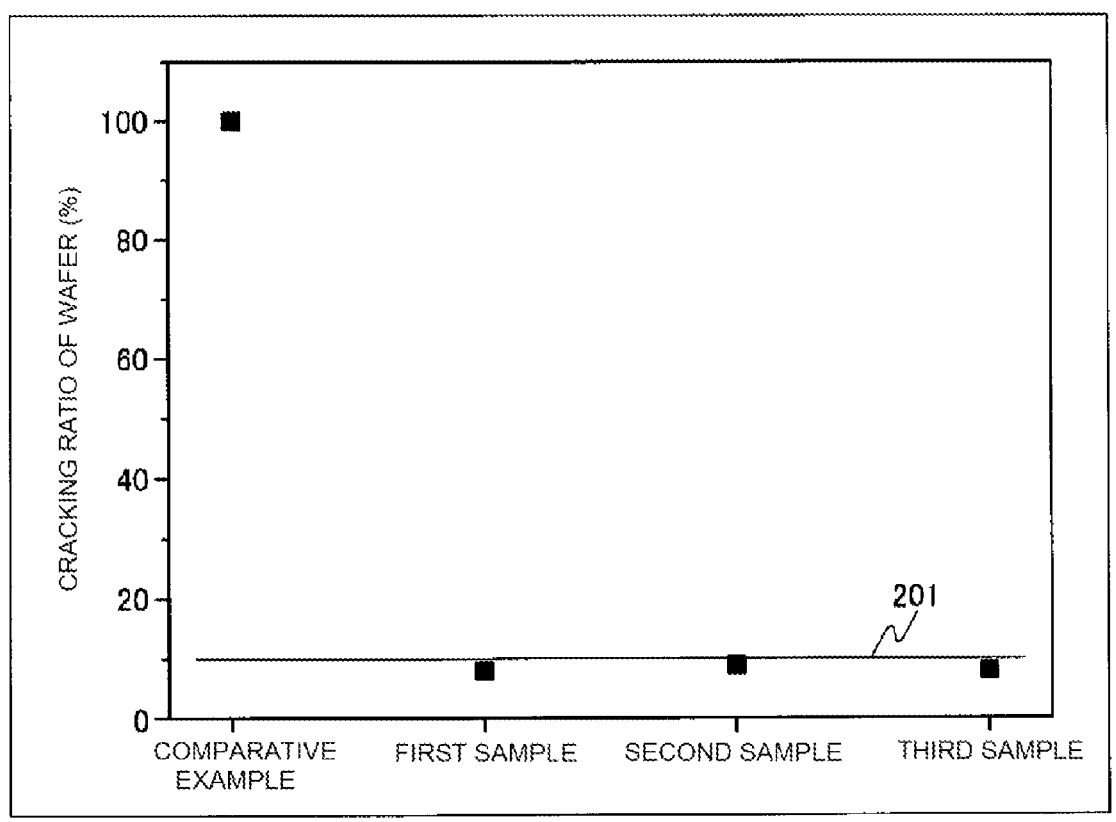
FIG. 26 is a characteristic diagram illustrating the cracking ratio of the semiconductor wafer in the semiconductor device manufacturing method according to the invention.

Next, the cracking ratio of an SiC wafer when the semiconductor device according to the invention was manufactured was verified. FIG. 26 is a characteristic diagram illustrating the cracking ratio of a semiconductor wafer in a method of manufacturing the semiconductor device according to the invention. First, the SiC wafers were used to manufacture the reverse blocking semiconductor devices according to Embodiments 1, 2, and 4 (hereinafter, referred to as first to third samples).

That is, as the first sample, the reverse blocking MOSFET was manufactured in which the p⁻ semiconductor region which came into contact with the drain electrode was not provided in the side surface and the rear surface of the chip (see FIG. 1). As the second sample, the reverse blocking MOSFET was manufactured in which the p⁻ semiconductor region which came into contact with the drain electrode was provided in the side surface of the chip and was selectively provided in the rear surface of the chip (see FIG. 9). As the third sample, the reverse blocking IGBT was manufactured in which the p⁻ semiconductor region which came into contact with the collector electrode was provided in the side surface and the rear surface of the chip (see FIG. 15).

For comparison, the supporting substrate was not used and the reverse blocking MOSFET or the reverse blocking IGBT was manufactured using a thinned SiC wafer (hereinafter, referred to as a comparative example). That is, the supporting substrate was not bonded to the SiC wafer and the comparative example was manufactured by the semiconductor device manufacturing method according to Embodiment 1. In the first to third samples and the comparative example, the breakdown voltage was 1200 V and the thickness t1 of the drift layer was 15 μm. Then, the cracking ratios of the SiC wafers when the first to third samples and the comparative example were manufactured were calculated.

As illustrated in FIG. 26, in the first to third samples, the cracking ratio of the SiC wafer was equal to or less than 10% (a solid line 201 in FIG. 26 indicates a cracking ratio line of 10%), which was a good value. On the other hand, in the comparative example, the cracking ratio of the SiC wafer was 100%. The result proved that the use of the supporting substrate as in the invention made it possible to reduce the cracking ratio of the SiC wafer and improve yield, even when the drift layer was thinned to 15 μm.

EXAMPLE 2

Figure 27:
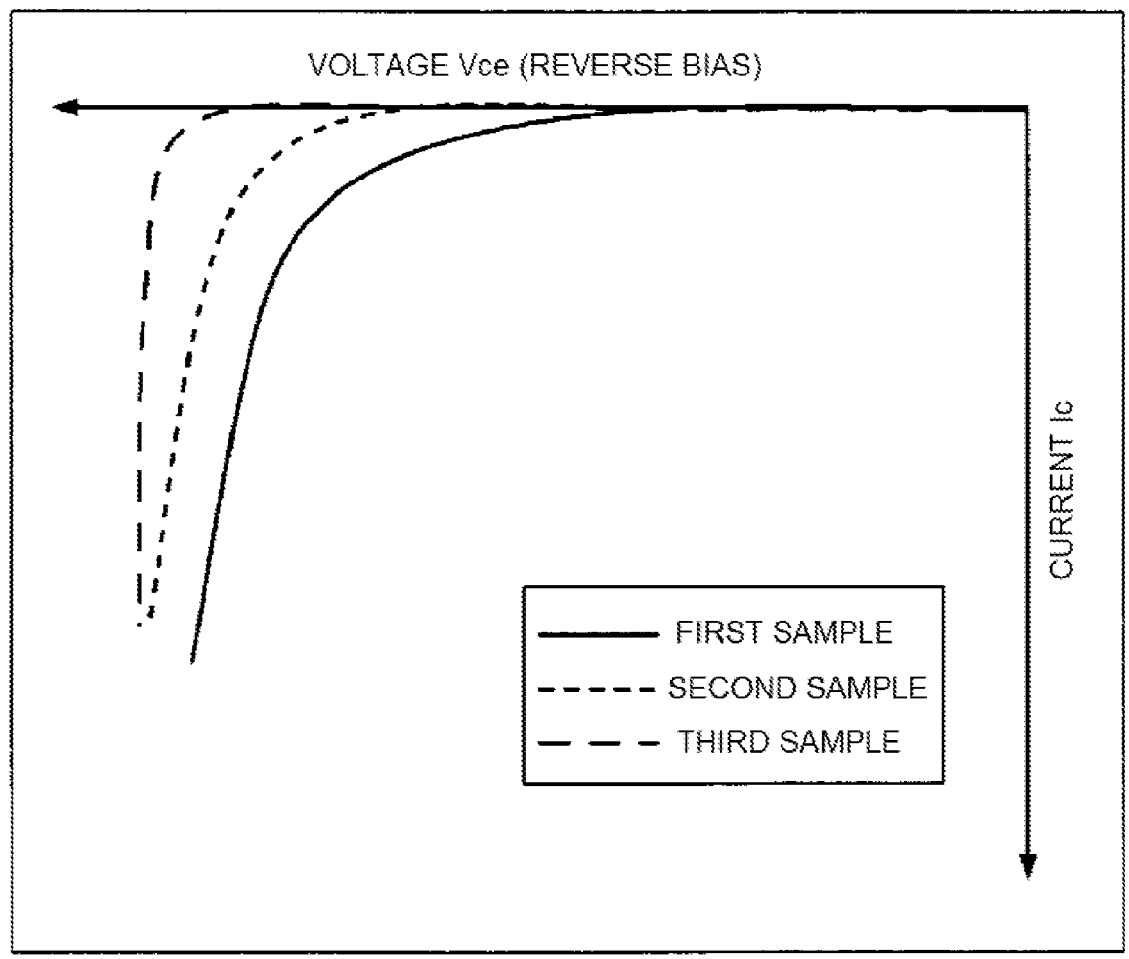
FIG. 27 is a characteristic diagram illustrating the electrical characteristics of the semiconductor device according to the invention.
Figure 28:
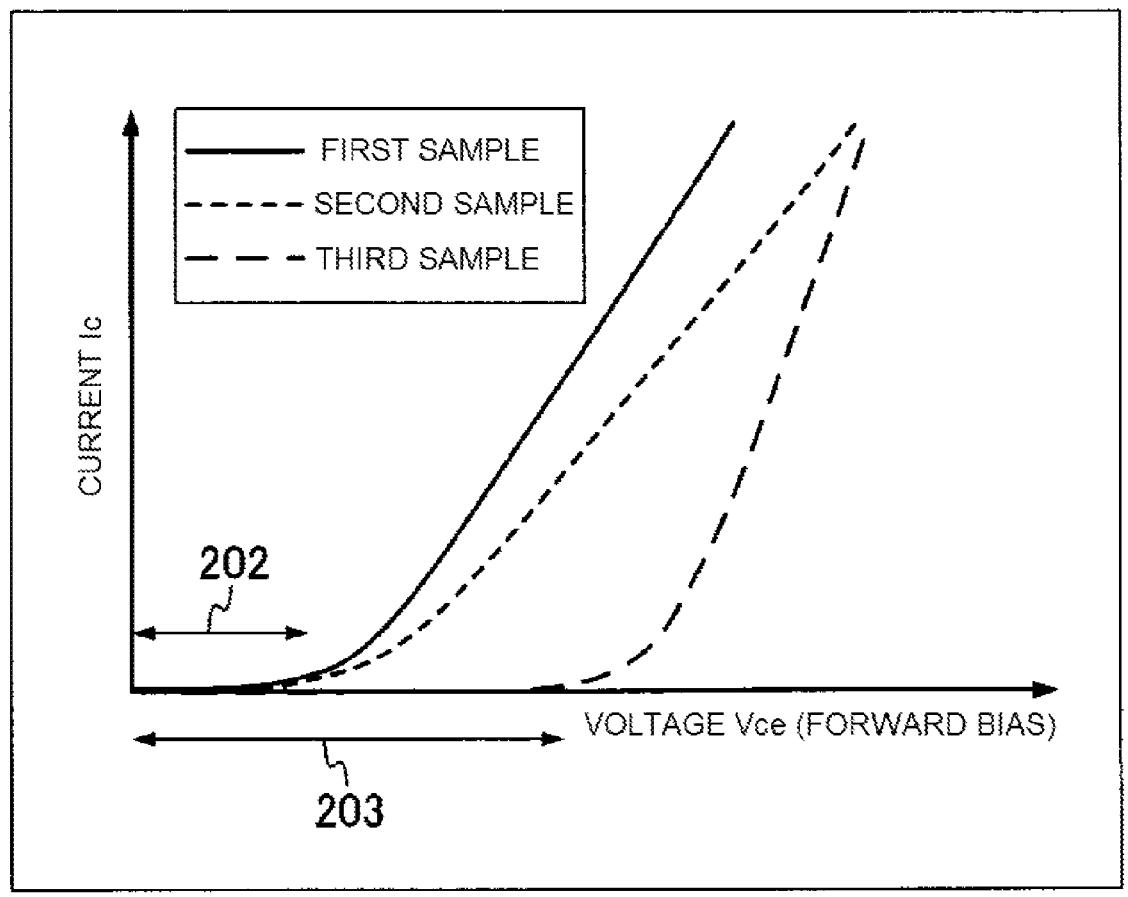
FIG. 28 is a characteristic diagram illustrating the electrical characteristics of the semiconductor device according to the invention.
Figure 29:
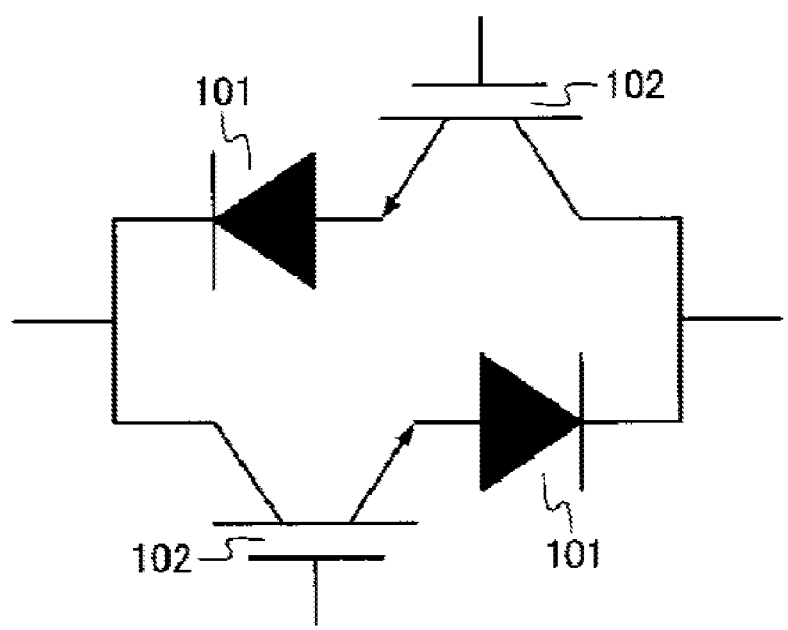
FIG. 29 is an equivalent circuit diagram illustrating a matrix converter according to the related art.
Figure 30:
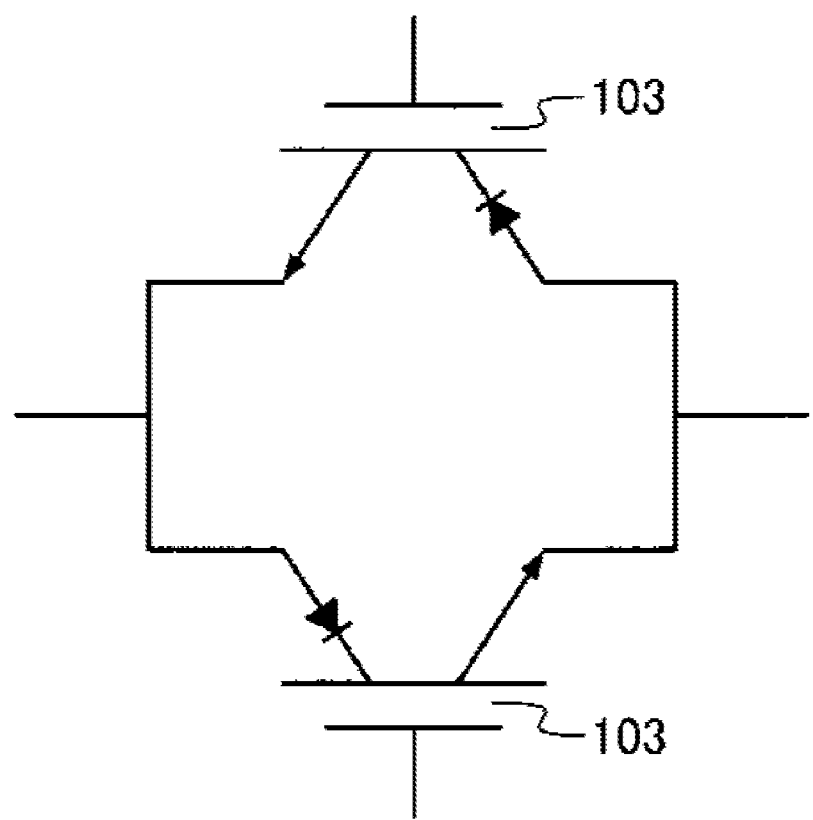
FIG. 30 is an equivalent circuit diagram illustrating a matrix converter according to the related art.
Figure 31:
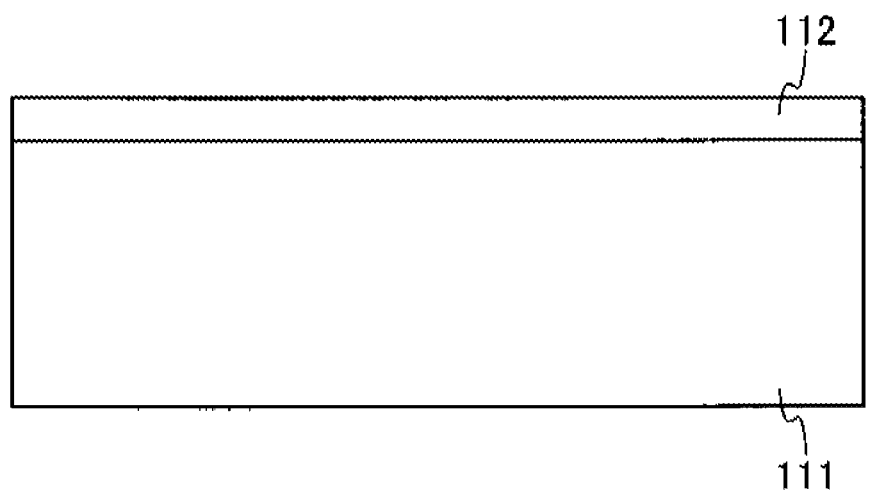
FIG. 31 is a cross-sectional view illustrating a method of manufacturing a reverse blocking IGBT with silicon according to the related art.
Figure 32:
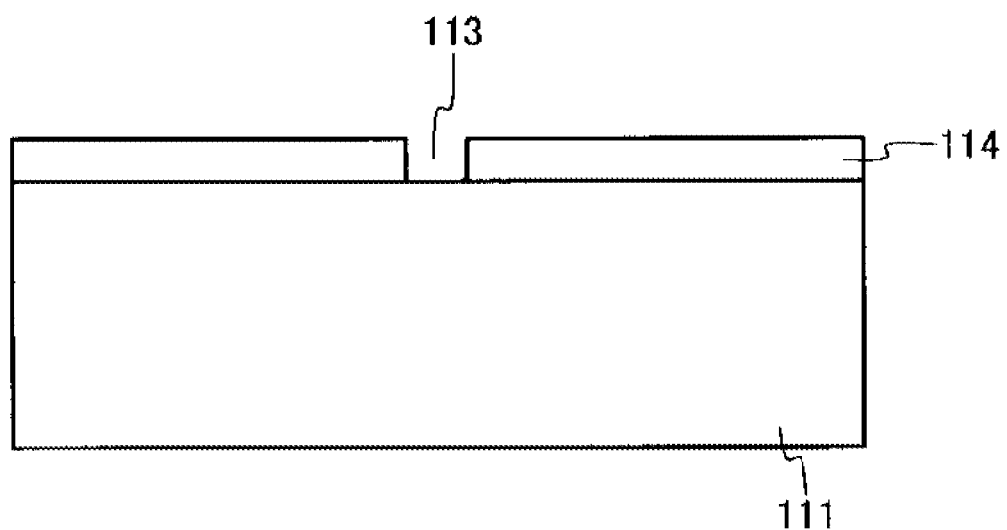
FIG. 32 is a cross-sectional view illustrating the method of manufacturing the reverse blocking IGBT with silicon according to the related art.
Figure 33:
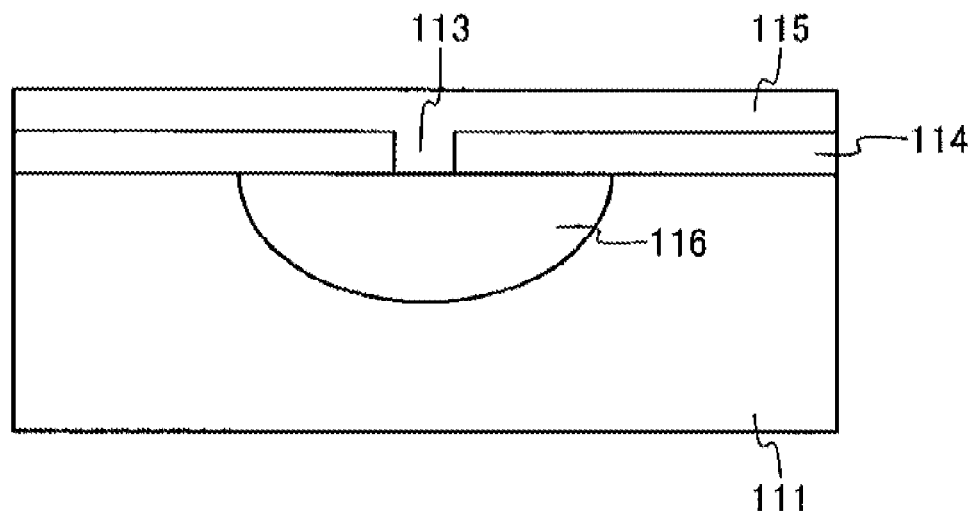
FIG. 33 is a cross-sectional view illustrating the method of manufacturing the reverse blocking IGBT with silicon according to the related art.
Figure 34:
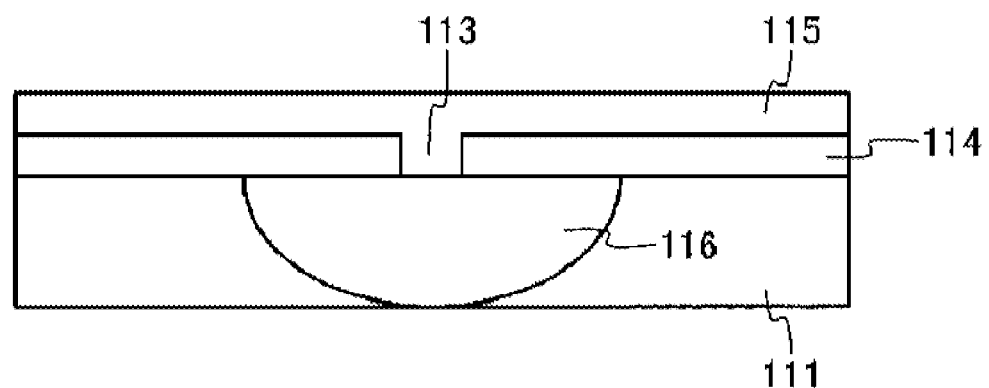
FIG. 34 is a cross-sectional view illustrating the method of manufacturing the reverse blocking IGBT with silicon according to the related art.
Figure 35:
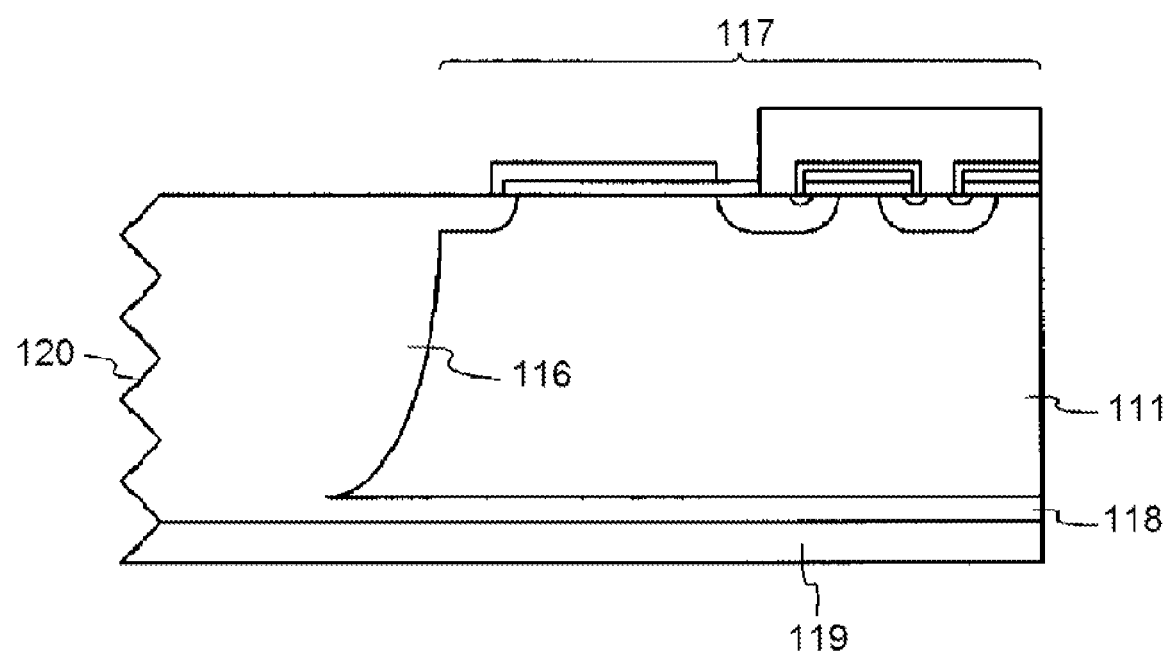
FIG. 35 is a cross-sectional view illustrating the method of manufacturing the reverse blocking IGBT with silicon according to the related art.
Figure 36:
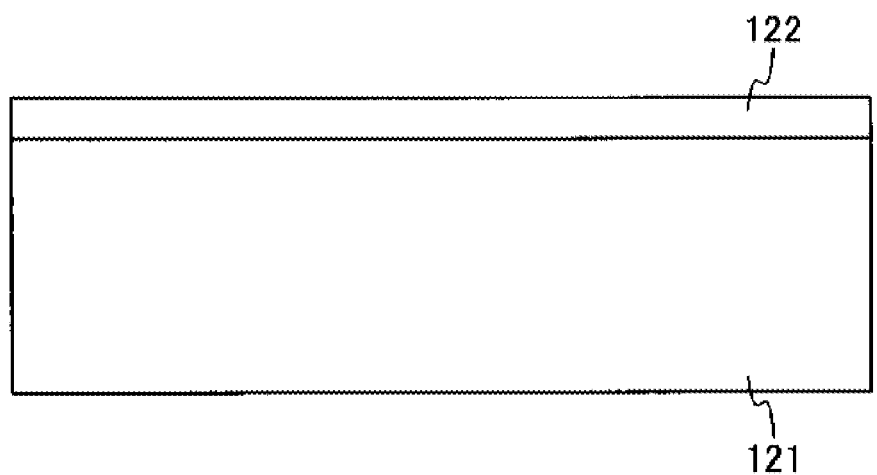
FIG. 36 is a cross-sectional view illustrating another example of the method of manufacturing the reverse blocking IGBT with silicon according to the related art.
Figure 37:
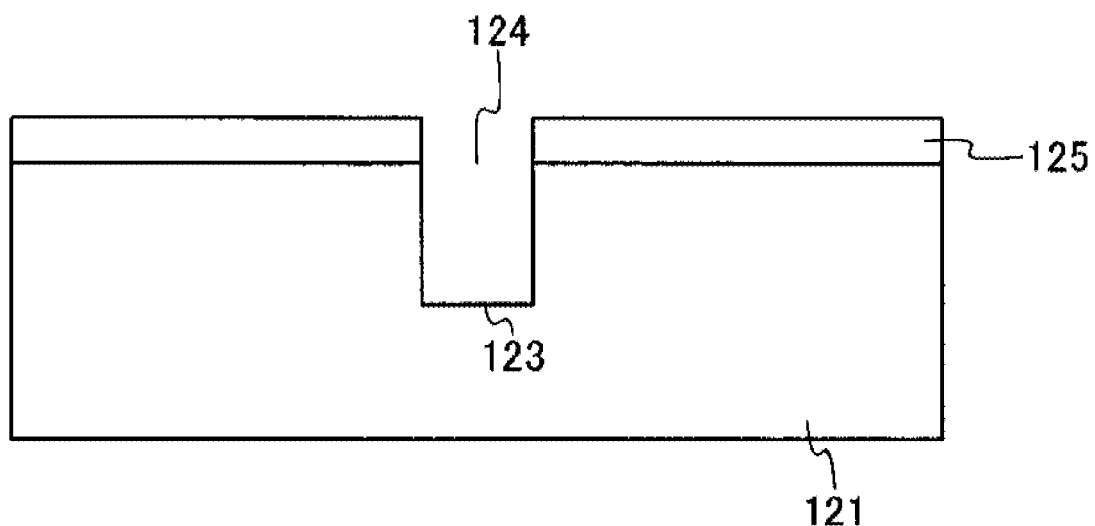
FIG. 37 is a cross-sectional view illustrating another example of the method of manufacturing the reverse blocking IGBT with silicon according to the related art.
Figure 38:
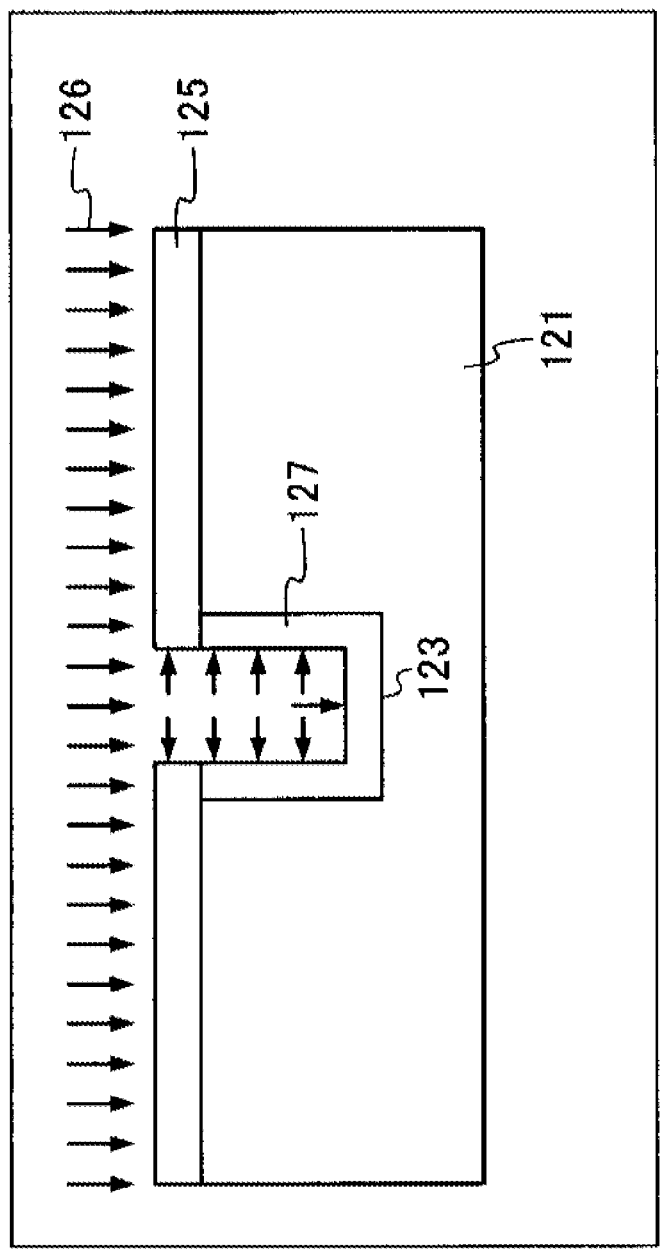
FIG. 38 is a cross-sectional view illustrating another example of the method of manufacturing the reverse blocking IGBT with silicon according to the related art.
Figure 39:
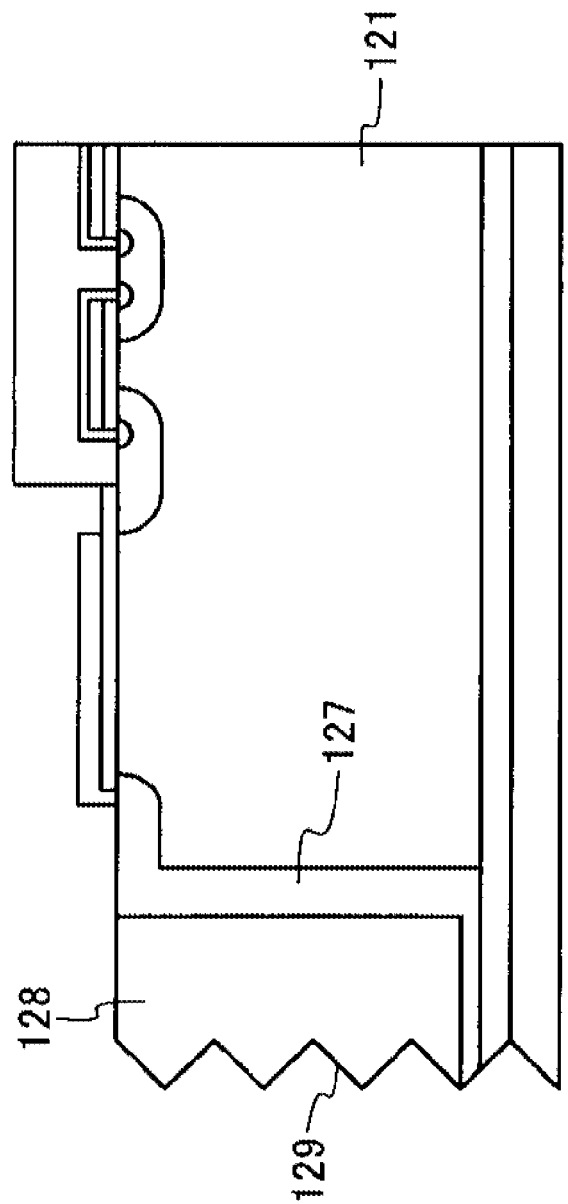
FIG. 39 is a cross-sectional view illustrating another example of the method of manufacturing the reverse blocking IGBT with silicon according to the related art.
Figure 40:
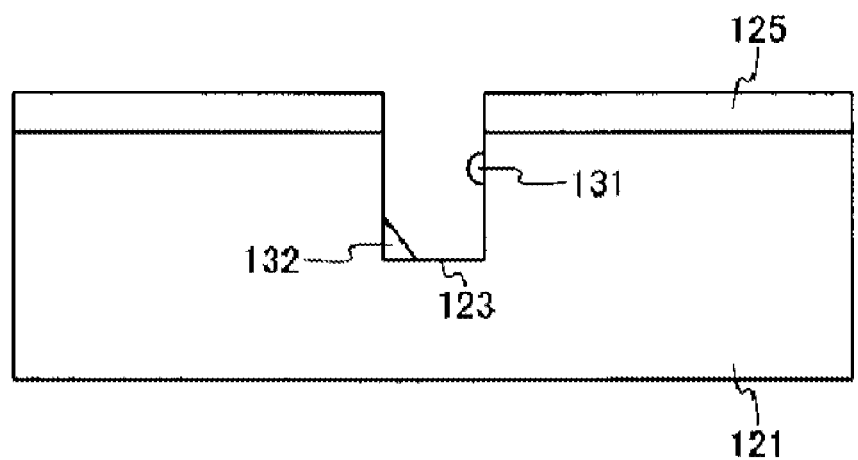
FIG. 40 is a cross-sectional view illustrating a main portion of the reverse blocking IGBT according to the related art during a manufacturing process.
Figure 41:
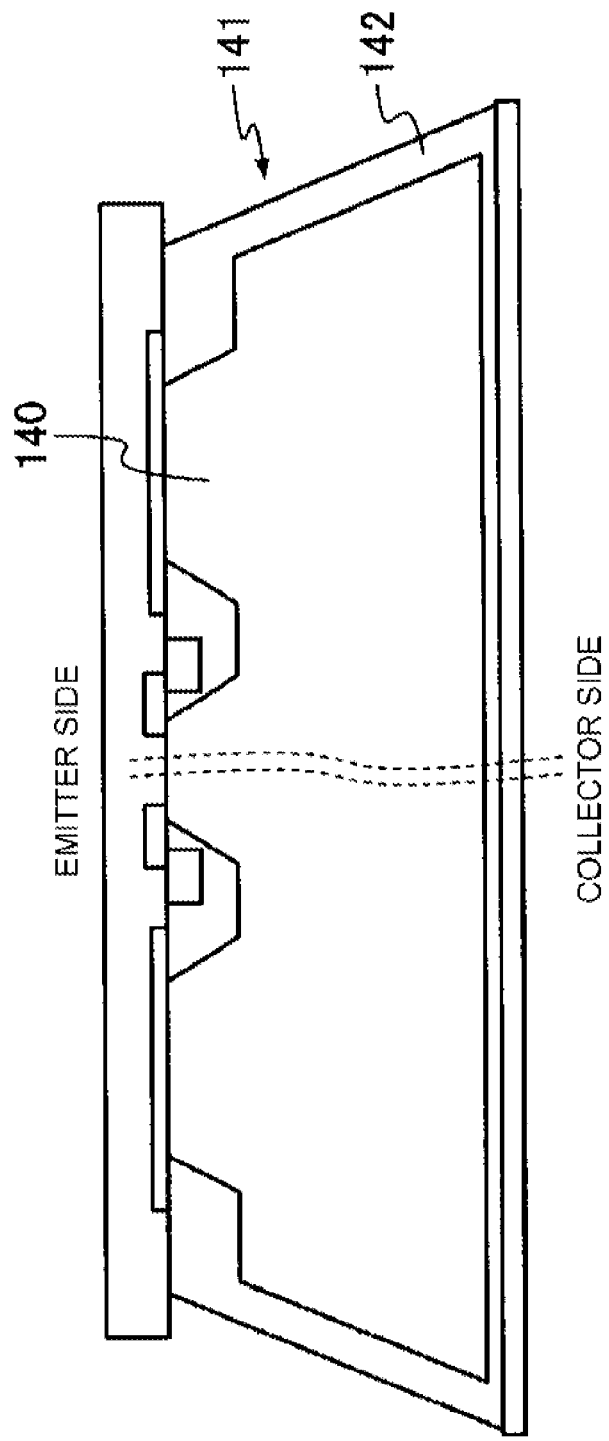
FIG. 41 is a cross-sectional view illustrating the reverse blocking IGBT according to the related art.
Figure 42:
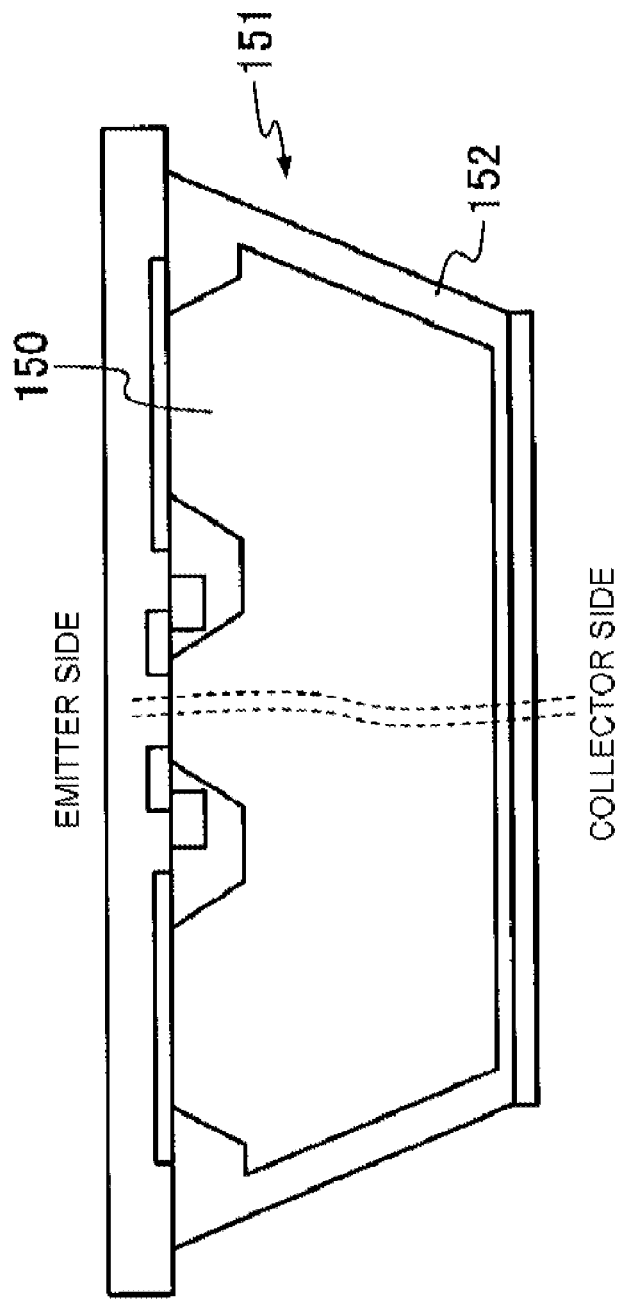
FIG. 42 is a cross-sectional view illustrating the reverse blocking IGBT according to the related art.

Next, electrical characteristics when a reverse bias was applied to the semiconductor device according to the invention were verified. FIGS. 27 and 28 are characteristic diagrams illustrating the electrical characteristics of the semiconductor device according to the invention. FIG. 27 shows the measurement result when the reverse bias is applied. FIG. 28 shows the measurement result when a forward bias is applied. First, similarly to Example 1, the first to third samples were manufactured. Then, in the first and second samples, a drain-source voltage when the reverse bias voltage was applied was measured. In the third sample, a collector-emitter voltage when the reverse bias voltage was applied was measured. In FIGS. 27 and 28, the measured voltage in the first to third samples is represented by a voltage Vce.

The measurement result illustrated in FIG. 27 proved that the voltage when the reverse bias was applied, that is, the reverse breakdown voltage in the first and second samples was substantially equal to that in the third sample. Therefore, the measurement result proved that, when MOSFETs were manufactured according to Embodiments 1 to 3, it was possible to reduce a leakage current when the reverse bias was applied and thus manufacture a reverse blocking MOSFET with substantially the same effect as the reverse blocking IGBT.

As can be seen from the result illustrated in FIG. 28, a built-in potential Vbi 202 was 0.8V in the first and second samples and a built-in potential Vbi 203 is was 2.5 V in the third sample. Therefore, the result proved that, when MOSFETs were manufactured according to Embodiments 1 to 3, it was possible to manufacture a reverse blocking MOM-ET with a built-in potential lower than the reverse blocking IGBT.

In each of the above-described embodiments, the reverse blocking semiconductor device is formed in the semiconductor chip with the side surface which is tapered such that the width of the semiconductor chip increases from the drain (collector) side to the source (emitter) side. However, a semiconductor chip with a side surface which is tapered such that the width of the semiconductor chip increases from the source (emitter) side to the drain (collector) side may be used. In addition, when the groove for exposing a portion of the chip, which will be the side surface, is formed in the rear surface of the semiconductor wafer, a groove with a side wall which is perpendicular to the main surface of the semiconductor wafer may be formed. Etching may be performed for the rear surface of the SiC wafer to reduce the thickness of the SiC wafer. In the above-described embodiments, the V groove which passes through the semiconductor wafer and reaches the adhesive layer is formed. However, the V groove may be formed at a depth which does not pass through the semiconductor wafer. For example, the V groove may be so deep that a region for forming the electrode film on the side surface of the chip is exposed. In this case, before each chip peels off from the tape, for example, the semiconductor wafer is diced into chips.

Industrial Applicability

As described above, the semiconductor device manufacturing method and the semiconductor device according to the invention are useful for a power semiconductor device which is used in a direct link conversion circuit, such as a matrix converter.

Reference Signs List
12 MOS GATE STRUCTURE
13 ADHESIVE LAYER
14 SUPPORTING SUBSTRATE
16 V GROOVE
17 CHIP
18 ELECTRODE FILM

The invention claimed is:

1. A semiconductor device manufacturing method comprising:
   forming a front surface element structure on a front surface of a semiconductor wafer of a first conductivity type;
   bonding a supporting substrate to said front surface;
   forming a groove in a rear surface of the wafer;
   implanting a first dose of a second-conductivity-type impurity into a side wall of the groove;
   activating the implanted first dose of second-conductivity-type impurity to form a first semiconductor region of a second conductivity type in a surface layer of the side wall of the groove;
   selectively implanting a second dose of the second-conductivity-type impurity into the rear surface of the wafer after the groove is formed in the wafer;
   activating the implanted second dose of second-conductivity-type impurity to selectively form a second semiconductor region of the second conductivity type in a surface layer of the rear surface of the wafer;
   providing an electrode film on the rear surface of the wafer to form a Schottky junction between the wafer and the electrode film; and
   peeling the supporting substrate from the wafer.

2. The semiconductor device manufacturing method according to claim 1, further comprising forming a field effect transistor in said wafer,
   wherein the front surface element structure is a front surface element structure of said field effect transistor, and the electrode film is a drain electrode.

3. The semiconductor device manufacturing method according to claim 1, wherein the width of the groove is gradually reduced from the rear surface of the wafer in a depth direction of the wafer.

4. The semiconductor device manufacturing method according to claim 1, wherein the groove passes through the wafer and reaches the supporting substrate.

5. A semiconductor device manufacturing method comprising:

forming a front surface element structure on a front surface of a semiconductor wafer of a first conductivity type;

bonding a supporting substrate to said front surface;

forming a groove in a rear surface of the wafer;

implanting a first dose of a second-conductivity-type impurity into the rear surface of the wafer;

activating the implanted first dose of second-conductivity-type impurity to form a third semiconductor region of a second conductivity type in a surface layer of the rear surface of the wafer;

implanting a second dose of the second-conductivity-type impurity into a side wall of the groove;

activating the implanted second dose of second-conductivity-type impurity to form a first semiconductor region of the second conductivity type in a surface layer of the side wall of the groove;

providing an electrode film on the side wall of the groove and the rear surface of the wafer to form a Schottky junction between the first and third semiconductor regions and the electrode film; and peeling the supporting substrate from the wafer.

6. The semiconductor device manufacturing method according to claim 5, wherein, after the first dose of the second-conductivity-type impurity is implanted into the rear surface of the wafer and the second dose thereof is implanted into the side wall of the groove, the first and second doses of implanted second-conductivity-type impurity are activated.

7. The semiconductor device manufacturing method according to claim 5, further comprising forming an insulated gate bipolar transistor in said wafer, wherein the front surface element structure is a front surface element structure of the insulated gate bipolar transistor, and the electrode film is a collector electrode.

8. The semiconductor device manufacturing method according to claim 5, wherein the groove passes through the wafer and reaches the supporting substrate.

9. The semiconductor device manufacturing method according to claim 5, wherein the width of the groove is gradually reduced from the rear surface of the wafer in a depth direction of the wafer.

* * * * *